(12) United States Patent
Ren et al.

(10) Patent No.: US 11,232,928 B2
(45) Date of Patent: Jan. 25, 2022

(54) MULTI-BEAM INSPECTION APPARATUS

(71) Applicant: ASML Netherlands B.V., Veldhoven (NL)

(72) Inventors: Weiming Ren, San Jose, CA (US);
Qian Zhang, San Jose, CA (US);
Xuerang Hu, San Jose, CA (US);
Xuedong Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 22 days.

(21) Appl. No.: 16/729,190

(22) Filed: Dec. 27, 2019

(65) Prior Publication Data

US 2020/0211811 A1    Jul. 2, 2020

Related U.S. Application Data

(60) Provisional application No. 62/787,157, filed on Dec. 31, 2018.

(51) Int. Cl.
*H01J 37/00* (2006.01)
*H01J 37/147* (2006.01)
(Continued)

(52) U.S. Cl.
CPC ........ *H01J 37/1477* (2013.01); *H01J 37/244* (2013.01); *H01J 37/28* (2013.01); *H01J 37/3177* (2013.01); *H01J 2237/24592* (2013.01)

(58) Field of Classification Search
USPC ........................................ 250/310
See application file for complete search history.

(56) References Cited

U.S. PATENT DOCUMENTS 5,136,167 A  *  8/1992  Langner .............. H01J 37/1472
                                            250/396 R
7,569,833 B2      8/2009  Kruit
                            (Continued)

FOREIGN PATENT DOCUMENTS

TW          200603196 A       1/2006
TW          201732259 A       9/2017
WO      WO 2018/197169 A1     11/2018

OTHER PUBLICATIONS

International Search Report and Written Opinion issued by the International Searching Authority in related PCT International Application No. PCT/EP2019/082625, dated Feb. 28, 2020 (16 pgs.).

(Continued)

*Primary Examiner* — Phillip A Johnston
(74) *Attorney, Agent, or Firm* — Finnegan, Henderson, Farabow, Garrett & Dunner, LLP

(57) ABSTRACT

A multi-beam inspection apparatus including an improved source conversion unit is disclosed. The improved source conversion unit may comprise a micro-structure deflector array including a plurality of multipole structures. The micro-deflector deflector array may comprise a first multipole structure having a first radial shift from a central axis of the array and a second multipole structure having a second radial shift from the central axis of the array. The first radial shift is larger than the second radial shift, and the first multipole structure comprises a greater number of pole electrodes than the second multipole structure to reduce deflection aberrations when the plurality of multipole structures deflects a plurality of charged particle beams.

15 Claims, 15 Drawing Sheets

(51) Int. Cl.
*H01J 37/244* (2006.01)
*H01J 37/28* (2006.01)
*H01J 37/317* (2006.01)

(56) References Cited

U.S. PATENT DOCUMENTS

| | | | |
|---|---|---|---|
| 8,987,677 B2 | 3/2015 | Wieland et al. | |
| 9,035,249 B1 * | 5/2015 | Frosien | H01J 37/1474 |
| | | | 250/310 |
| 10,236,156 B2 * | 3/2019 | Ren | H01J 37/28 |
| 10,483,080 B1 * | 11/2019 | Cook | H01J 37/09 |
| 2003/0209676 A1 | 11/2003 | Loschner et al. | |
| 2006/0131698 A1 | 6/2006 | Jeong et al. | |
| 2012/0273690 A1 | 11/2012 | Wieland et al. | |
| 2016/0284505 A1 | 9/2016 | Ren et al. | |

OTHER PUBLICATIONS

Office Action issued by the Intellectual Property Office (IPO) in related (ROC) Taiwanese Patent Application No. 108145444, dated Aug. 6, 2020 (8 pgs.).
Office Action of the Intellectual Property Office of Taiwan issued in related Taiwanese Patent Application No. 108145444; dated Apr. 30, 2021 (11 pgs.).

* cited by examiner

MULTI-BEAM INSPECTION APPARATUS

CROSS-REFERENCE TO RELATED APPLICATIONS

This application claims priority of U.S. application 62/787,157 which was filed on Dec. 31, 2018, and which is incorporated herein in its entirety by reference.

FIELD

The embodiments provided herein generally relate to a multi-beam inspection apparatus, and more particularly, a multi-beam inspection apparatus including an improved source conversion unit.

BACKGROUND

When manufacturing semiconductor integrated circuit (IC) chips, pattern defects or uninvited particles (residuals) inevitably appear on a wafer or a mask during fabrication processes, thereby reducing the yield. For example, uninvited particles may be troublesome for patterns with smaller critical feature dimensions, which have been adopted to meet the increasingly more advanced performance requirements of IC chips.

Pattern inspection tools with a charged particle beam have been used to detect the defects or uninvited particles. These tools typically employ a scanning electron microscope (SEM). In a SEM, a beam of primary electrons having a relatively high energy is decelerated to land on a sample at a relatively low landing energy and is focused to form a probe spot thereon. Due to this focused probe spot of primary electrons, secondary electrons will be generated from the surface. The secondary electrons may comprise backscattered electrons, secondary electrons, or Auger electrons, resulting from the interactions of the primary electrons with the sample. By scanning the probe spot over the sample surface and collecting the secondary electrons, pattern inspection tools may obtain an image of the sample surface.

SUMMARY

The embodiments provided herein disclose a particle beam inspection apparatus, and more particularly, an inspection apparatus using a plurality of charged particle beams.

In some embodiments, a micro-structure deflector array in the inspection apparatus includes a plurality of multipole structures, each multipole structure comprising a plurality of pole electrodes. The micro-deflector array includes a first multipole structure of the plurality of multipole structures, which has a first radial shift from a central axis of the array, and a second multipole structure of the plurality of multipole structures, which has a second radial shift from the central axis of the array. The first radial shift is larger than the second radial shift. Furthermore, the first multipole structure comprises a greater number of pole electrodes than the second multipole structure to reduce deflection aberrations when the plurality of multipole structures deflects a plurality of charged particle beams.

In some embodiments, the micro-structure deflector array may include one or more layers of multipole structures. A first layer of the plurality of multipole structures comprises a first multipole structure having a first radial shift from a central axis of the array and a second multipole structure having a second radial shift from the central axis of the array. The first radial shift is larger than the second radial shift. Furthermore, the first multipole structure comprises a greater number of pole electrodes than the second multipole structure to reduce deflection aberrations of the corresponding charge particle beams. The micro-structure deflector array also includes a second layer of multipole structures of the plurality of multipole structures, which comprises a third multipole structure having a third radial shift from the central axis of the array.

In some embodiments, a method of manufacturing the micro-structure deflector array is provided. The micro-structure deflector array includes a plurality of multipole structures and each multipole structure comprising a plurality of pole electrodes. The method comprises forming the first multipole structure to have a first radial shift from a central axis of the array. The method further comprises forming the second multipole structure to have a second radial shift from the central axis of the array, wherein the first radial shift is larger than the second radial shift and the first multipole structure has a different number of pole electrodes from the second multipole structure.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
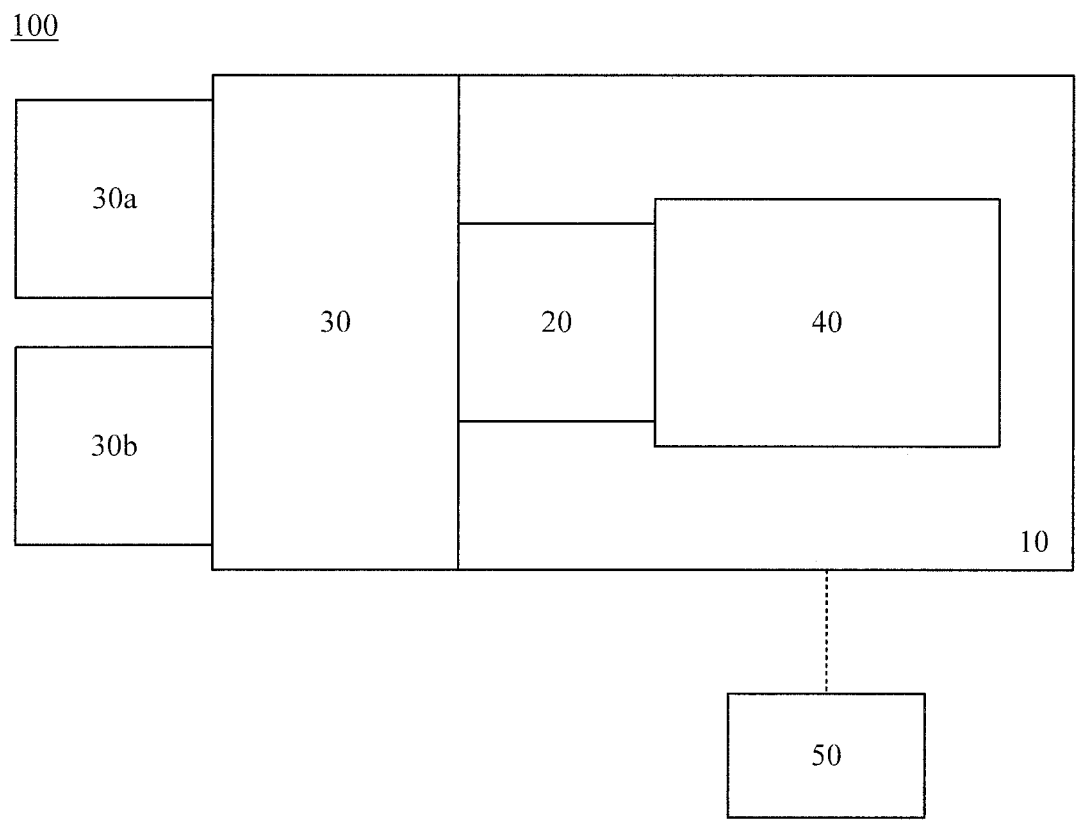
FIG. 1 is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, while reducing the physical size of the devices, can be accomplished by significantly increasing the packing density of circuit components such as transistors, capacitors, diodes, etc. on an IC chip. For example, an IC chip of a smart phone, which is the size of a thumbnail, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get to a 75% yield, each individual step must have a yield greater than 99.4%, and if the individual step yield is 95%, the overall process yield drops to 7%.

While high process yield is desirable in an IC chip manufacturing facility, maintaining a high wafer throughput, defined as the number of wafers processed per hour, is also essential. High process yield and high wafer throughput can be impacted by the presence of defects, especially if operator intervention is required for reviewing the defects. Thus, high throughput detection and identification of micro and nano-sized defects by inspection tools (such as a SEM) is essential for maintaining high yield and low cost.

A SEM scans the surface of a sample with a focused beam of primary electrons. The primary electrons interact with the sample and generate secondary electrons. By scanning the sample with the focused beam and capturing the secondary electrons with a detector, the SEM creates an image of the scanned area of the sample. For high throughput inspection, some of the inspection systems use multiple focused beams of primary electrons. As the multiple focused beams can scan different parts of a wafer at the same time, multi-beam inspection system can inspect a wafer at a much higher speed than a single-beam inspection system.

In a conventional multi-beam inspection system, however, increasing the number of focused beams means that more off-axis (not on a primary optical axis of the system) focused beams are employed. An off-axis focused beam has aberrations that increase with its radial shift from the primary optical axis, and therefore degrades the quality of images that are produced for inspection. This aberration increase is, in some cases, a consequence of the directions of some of the electron beams needing to be changed substantially to scan the surface of the wafer. When the number of electron beams are increased, some of the electron beams need to be routed away from the central axis of the scanning device. To ensure all electron beams arrives at the surface of the wafer at the right angle, these off-center electron beams are manipulated more than the other electron beams around the central axis. This higher level of manipulation may cause blurry and out-of-focus images of the sample wafer. One aspect of the present disclosure relates to a system and a method of reducing aberrations of off-axis focused beams to minimize degradation of image quality. This can be achieved by using inherently small-aberration source-conversion unit.

Relative dimensions of components in drawings may be exaggerated for clarity. Within the following description of drawings the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Reference is now made to FIG. 1, which is a schematic diagram illustrating an exemplary charged particle beam inspection system 100, consistent with embodiments of the present disclosure. As shown in FIG. 1, charged particle beam inspection system 100 includes a main chamber 10, a load lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load lock chamber 20.

Load lock chamber 20 may be connected to a load lock vacuum pump system (not shown), which removes gas molecules in load lock chamber 20 to reach a first pressure below the atmospheric pressure. After reaching the first pressure, one or more robot arms (not shown) transport the wafer from load lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

A controller 50 is electronically connected to electron beam tool 40. Controller 50 may be a computer configured to execute various controls of charged particle beam inspection system 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2:
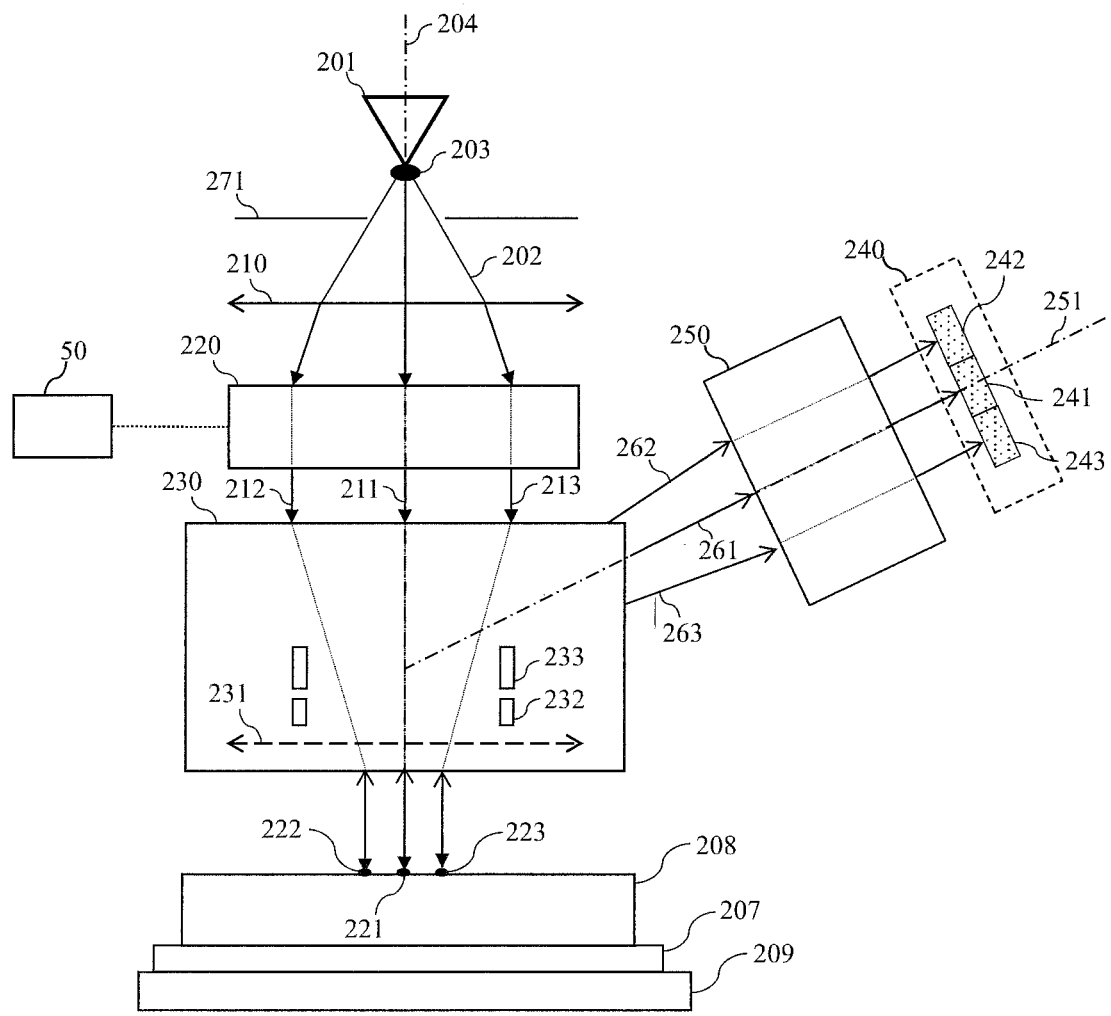
FIG. 2 is a schematic diagram illustrating an exemplary multi-beam apparatus that is part of the exemplary charged particle beam inspection system of FIG. 1, consistent with embodiments of the present disclosure.

Reference is now made to FIG. 2, which is a schematic diagram illustrating an exemplary electron beam tool 40 including a multi-beam inspection tool that is part of the exemplary charged particle beam inspection system 100 of FIG. 1, consistent with embodiments of the present disclosure. Multi-beam electron beam tool 40 (also referred to herein as apparatus 40) comprises an electron source 201, a gun aperture plate 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 40 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, gun aperture plate 271, condenser lens 210, source conversion unit 220, beam separator 233, deflection scanning unit 232, and primary projection system 230 may be aligned with a primary optical axis 204 of apparatus 40. Secondary projection system 250 and electron detection device 240 may be aligned with a secondary optical axis 251 of apparatus 40.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Figure 3A:
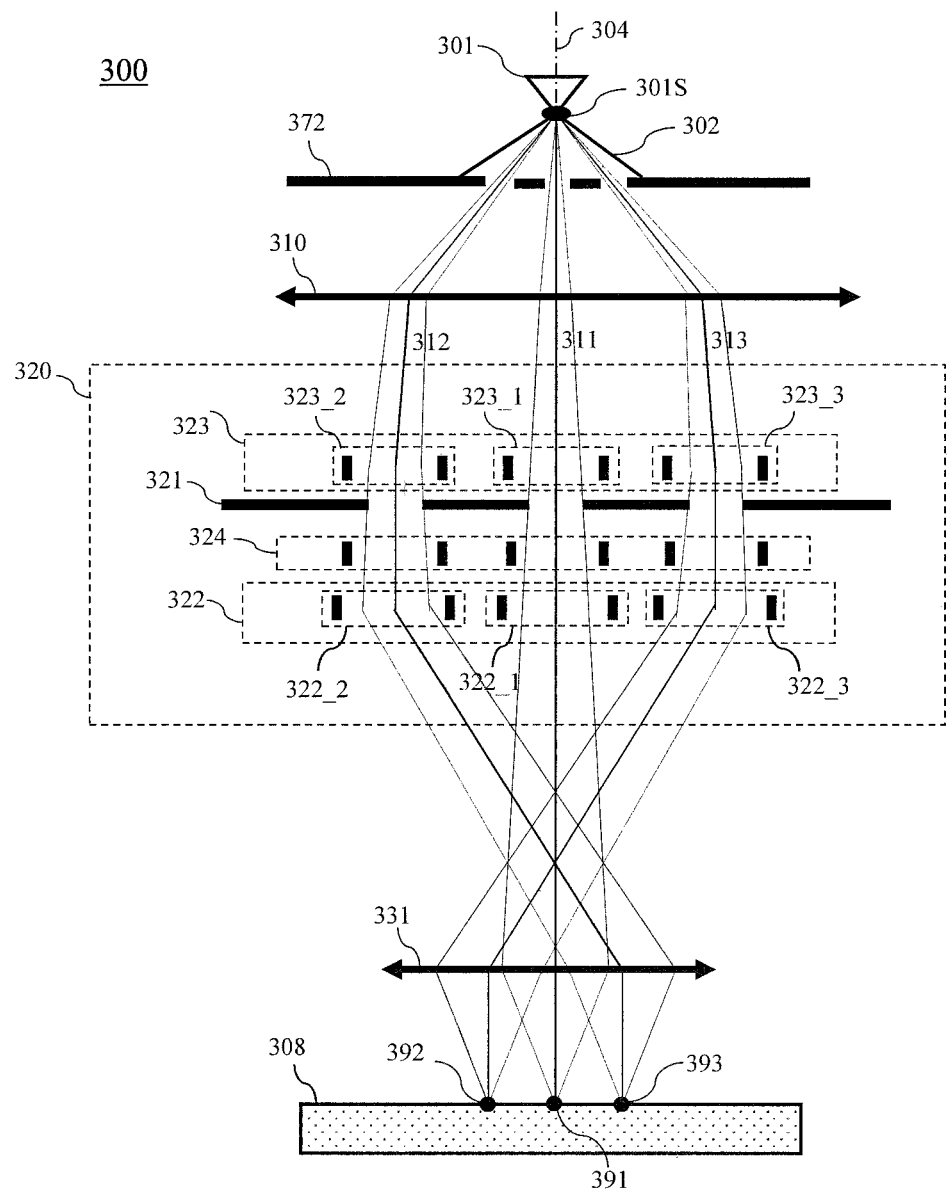
FIG. 3A is a schematic diagram of exemplary multi-beam apparatus illustrating an exemplary configuration of source conversion unit of the exemplary charged particle beam inspection system of FIG. 1, consistent with embodiments of the present disclosure.

Source conversion unit 220 may comprise an image-forming element array (e.g., image-forming element array 322 of FIG. 3A), an aberration compensator array (e.g., aberration compensator array 324 of FIG. 3A), a beam-limit aperture array (e.g., beam-limit aperture array 321 of FIG. 3A), and a pre-bending micro-deflector array (e.g., pre-bending micro-deflector array 323 of FIG. 3A). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiment, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 50 may be connected to various parts of charged particle beam inspection system 100 of FIG. 1, such as source conversion unit 220, electron detection device 240, primary projection system 230, or motorized stage 209. In some embodiments, as explained in further details below, controller 50 may perform various image and signal processing functions. Controller 50 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be a movable condenser lens that may be configured so that the position of its first principle plane is movable. The movable condenser lens may be configured to be magnetic, which may result in off-axis beamlets 212 and 213 illuminating source conversion unit 220 with rotation angles. The rotation angles change with the focusing power or the position of the first principal plane of the movable condenser lens. Condenser lens 210 may be an anti-rotation condenser lens that may be configured to keep the rotation angles unchanged while the focusing power of condenser lens 210 is changed. In some embodiments, condenser lens 210 may be a movable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Gun aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons.

Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 50 or a signal processing system (not shown), e.g. to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 50). In some embodiments, each detection element 241, 242, and 243 may comprise one or more pixels. The intensity signal output of a detection element may be a sum of signals generated by all the pixels within the detection element.

In some embodiments, controller 50 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 50 may be configured to perform image processing steps with the multiple images of the same location of sample 208.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 50 may control motorized stage 209 to move sample 208 during inspection of sample 208. In some embodiments, controller 50 may enable motorized stage 209 to move sample 208 in a direction continuously at a constant speed. In other embodiments, controller 50 may enable motorized stage 209 to change the speed of the movement of sample 208 overtime depending on the steps of scanning process.

Although FIG. 2 shows that apparatus 40 uses three primary electron beams, it is appreciated that apparatus 40 may use two or more number of primary electron beams. The present disclosure does not limit the number of primary electron beams used in apparatus 40.

Reference is now made to FIG. 3A, which is a schematic diagram of exemplary multi-beam apparatus illustrating an exemplary configuration of source conversion unit of the exemplary charged particle beam inspection system of FIG. 1, consistent with embodiments of the present disclosure. In some embodiments, apparatus 300 may comprise an election source 301, a pre-beamlet-forming aperture array 372, a condenser lens 310 (similar to condenser lens 210 of FIG. 2), a source conversion unit 320 (similar to source conversion unit 120 of FIG. 2), an objective lens 331 (similar to objective lens 231 of FIG. 2), and a sample 308 (similar to sample 208 of FIG. 2). Election source 301, pre-beamlet-forming aperture array 372, condenser lens 310, source conversion unit 320, and objective lens 331 are aligned with a primary optical axis 304 of the apparatus. Electron source 301 generates a primary-electron beam 302 along primary optical axis 304 and with a source crossover (virtual or real) 301S. Pre-beamlet-forming aperture array 372 cuts the peripheral electrons of primary electron beam 302 to reduce the Coulomb Effect. Primary-electron beam 302 may be trimmed into three beamlets 311, 312 and 313 by pre-beamlet-forming aperture array 372 of a pre-beamlet-forming mechanism.

In some embodiments, source conversion unit 320 may include a beamlet-limit aperture array 321 with beam-limit apertures configured to limit beamlets 311, 312, and 313 of primary electron beam 302. Source conversion unit 320 may also include an image-forming element array 322 with image-forming micro-deflectors, 322_1, 322_2, and 3223, which are configured to deflect beamlets 311, 312, and 313 towards optical axis 304 to form virtual images of source crossover 301S. The virtual images are projected onto sample 308 by objective lens 331 and form probe spots, 391, 392, and 393 thereon. Source conversion unit 320 may further comprise an aberration compensator array 324 configured to compensate aberrations of probe spots, 391, 392, and 393. In some embodiments, aberration compensator array 324 may include a field curvature compensator array (not shown) with micro-lenses which are configured to compensate field curvature aberrations of probe spots, 391, 392, and 393, respectively. In some embodiments, aberration compensator array 324 may include an astigmatism compensator array (not shown) with micro-stigmators which are configured to compensate astigmatism aberrations of probe spots, 391, 392, and 393, respectively.

In some embodiments, source conversion unit 320 may further comprise a pre-bending micro-deflector array 323 with pre-bending micro-deflectors 323_1, 323_2, and 323_3 to bend beamlets 311, 312, and 313 respectively to be normally incident onto beamlet-limit aperture array 321. In some embodiments, condenser lens 310 may focus three beamlets 311, 313, and 313 to become a parallel beam along primary optical axis 304 and perpendicularly incident onto source conversion unit 320.

In some embodiments, image-forming element array 322, aberration compensator array 324, and pre-bending micro-deflector array 323 may comprise multiple layers of micro-deflectors, micro-lenses, or micro-stigmators.

In source conversion unit 320, beamlets 311, 312 and 313 of primary electron beam 302 are respectively deflected by micro-deflectors 322_1, 322_2 and 322_3 of image-forming element array 322 towards the primary optical axis 304. It is appreciated that beamlet 311 may already be on optical axis 304 prior to reaching micro-deflector 322_1; accordingly, beamlet 311 may not be deflected by micro-deflector 322_1.

Objective lens 331 focuses beamlets onto the surface of sample 308, i.e., projecting the three virtual images onto the sample surface. The three images formed by three beamlets 311~313 on the sample surface form three probe spots 391, 392 and 393 thereon. The deflection angles of beamlets 311~313 are adjusted to reduce the off-axis aberrations of three probe spots 391~393 due to objective lens 331, and the three deflected beamlets consequently pass through or approach the front focal point of objective lens 331.

A deflection angle of a beamlet deflected by a micro-deflector (e.g., a micro-deflector in image-forming element array 322) corresponds with a radial shift of the beamlet (i.e., distance from optical axis 304 to the corresponding beamlet). The deflection angle increases as the radial shift increases. Beamlets having the same radial shifts have the same or substantially the same deflection angles. For example, as shown in an exemplary multipole structure array with a 3×3 array configuration in FIG. 3B, the deflection angle of micro-deflector 322_2 may be equal to the deflection angle of micro-deflector 322_3, if their radial shifts 328 and 329 are the same. Moreover, the deflection directions of beamlets are related to their corresponding radial shift directions. Furthermore, the aberrations of beamlet (e.g., field curvature aberrations and astigmatism aberrations) increases as the radial shift increases. The aberrations of beamlet having the same or substantially same radial shifts are same or substantially same, and the directions of astigmatism aberrations are related to the directions of their radial shifts.

Figure 3B:
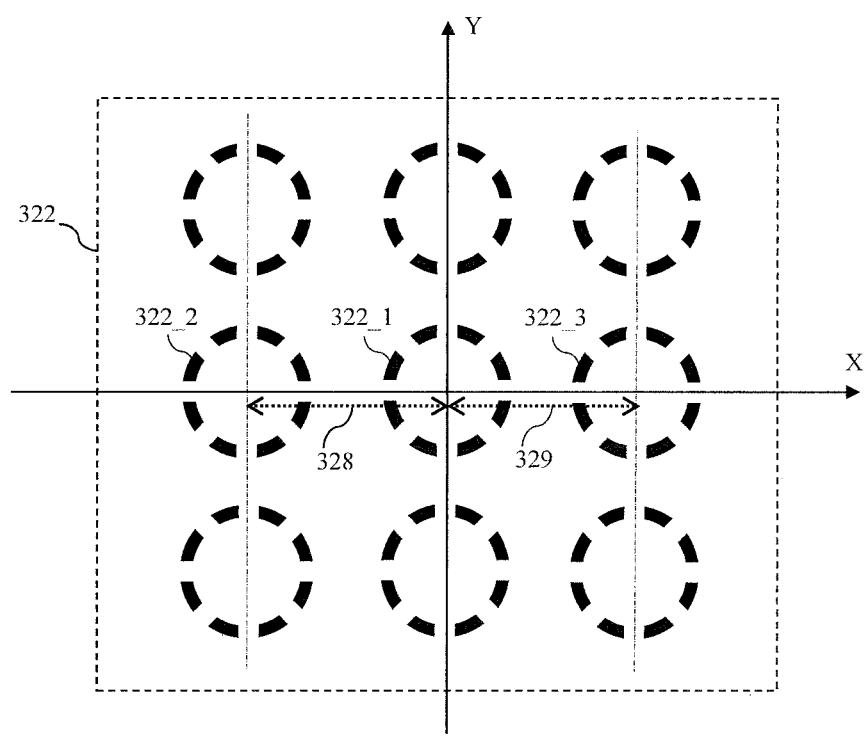
FIG. 3B is a schematic diagram of exemplary multipole structure array with a 3×3 configuration that is part of exemplary source conversion unit of FIG. 3A.

FIG. 3B shows a 3×3 image-forming micro-deflector array configuration that can deflect total nine beamlets simultaneously. As the number of beamlets increases, the size of the array increases as well. In a large image-forming micro-deflector array, therefore, some of beamlets would be located further away from the optical axis (e.g., optical axis 304 of FIG. 3A) of the apparatus, and the deflection angles thereof increase accordingly. Deflection aberrations generated by a micro-deflector increase with deflection angle thereof. Therefore, non-uniformity of the corresponding probe spots increases with the number of beamlets. While FIG. 3B shows image-forming micro-deflector array as an example, it is appreciated that a similar relationship between the deflection aberrations and the size of array may exist in other types of micro-deflector arrays.

Figure 4:
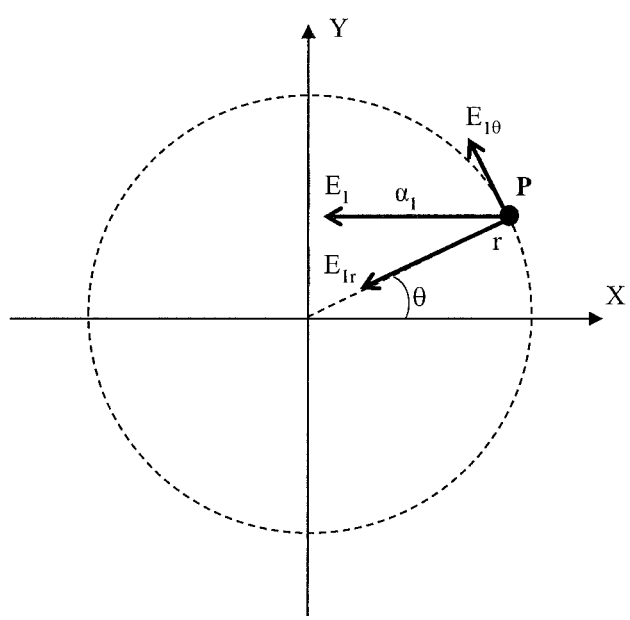
FIG. 4 is an illustration of distributions of radial and tangential electrostatic fields within a multipole structure.
Figure 5A:
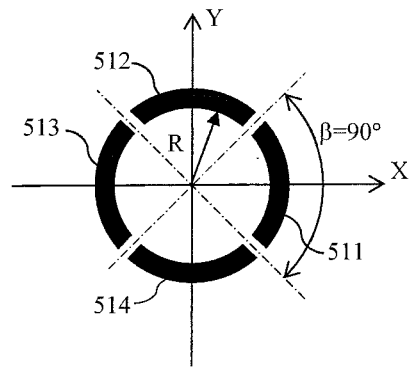
FIGS. 5A, 5B, 5C, 5D, and 5E are schematic diagrams of exemplary multipole structures.
Figure 5B:
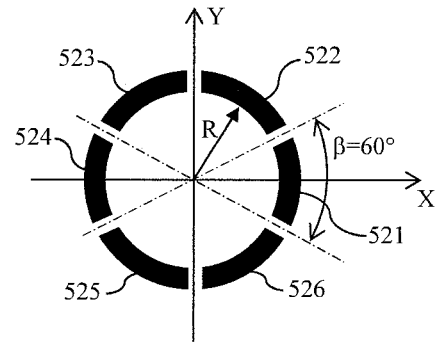
Figure 5C:
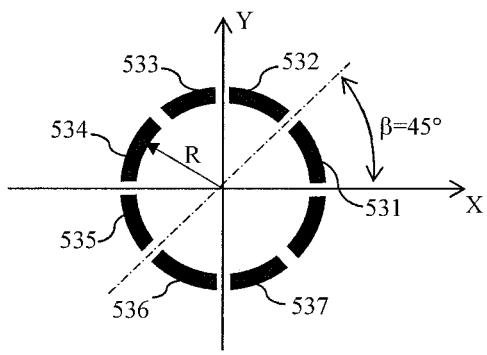
Figure 5D:
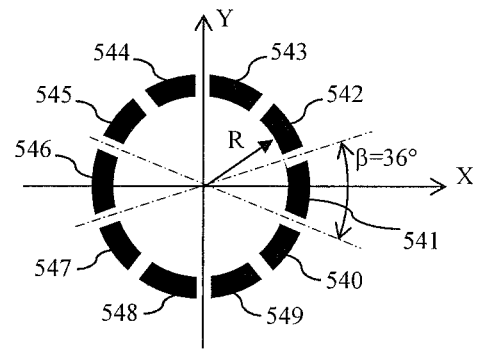
Figure 5E:
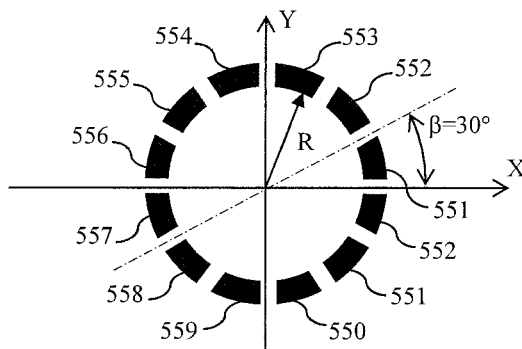

Reference is now made to FIG. 4, which is an illustration of distributions of radial and tangential electrostatic fields of first order electric field $E_1$ within a deflector. The radial and tangential components $E_r$ and $E_\theta$ of electric field E at a spatial point (r, θ) inside a deflector with a center axis may be represented as equations (1) and (2), respectively:

$$E_r(r, \theta) = \sum_{k=1,3,5,...}^{\infty} E_k \cdot \cos(k\theta); \quad (1)$$

$$E_\theta(r, \theta) = -\sum_{k=1,3,5,...}^{\infty} E_k \cdot \sin(k\theta). \quad (2)$$

The strength and direction angle $\alpha_k$ of the $K_{th}$ order electric field $E_k$ are $E_k = k \cdot r^{k-1} \cdot d_k$, and $\alpha_k = k\theta$. $d_k$ is the $K_{th}$ order component on the center axis or called as $K_{th}$ order on-axis component. Accordingly, $E_1$ shown in FIG. 4 is, $E_1 = d_1$, and $\alpha_k = \theta$. The strength and direction of the first order electric field $E_1$ does not change with r or θ. Therefore, the first order electric field (i.e., $E_1$ field or $d_1$ component) is desired to deflect an electron beam, and the other higher order on-axis components (e.g., $d_{2n+1}$) need to be reduced or even eliminated. The larger the deflection angle is, the stronger the $E_1$ field or $d_1$ component will be needed.

A multi-equal-pole deflector may be defined as a multi-pole structure deflector with a center axis and even number of pole electrodes (e.g., 2, 4, 6, 8, 10, so on). In a section normal to the center axis of the deflector, inner outlines of all pole electrodes are in a circle having a radius R and equally segmented with segment angle β. For example, FIGS. 5A, 5B, 5C, 5D, and 5E show deflectors with four, six, eight, ten, and twelve pole electrodes, and 90°, 60°, 45°, 36°, and 30° segment angles, β respectively.

Numbers P, division angles β, and potentials of pole electrodes em in a multi-equal-pole deflector may be configured to generate d1 while making d2n+1 as small as possible. The pole electrodes em are counted from the X-axis anticlockwise. For example, in FIG. 5A, electrodes 511, 512, 513 and 514 are $e_1$, $e_2$, $e_3$ and $e_4$ respectively. Table 1 shows an excitation setting of relative excitation voltages that can be applied to each electrode $e_m$ to generate $E_1$ parallel to the X axis. In accordance with Table 1, Table 2 shows the on-axis components of electric fields with respect to the number of pole electrodes. By rotating the setting of relative excitation voltages in Table 1 through one or more pole electrodes, as shown in Table 3, $E_1$ will accordingly rotate one or more times of segment angle β. In Table 3, the excitation setting in Table 1 is rotated one time of segment angle for 4-pole deflector and 6-pole deflector, two times of segment angle for 8-pole deflector and 10-pole deflector, three times of segment angle for 12-pole deflector. Combining the excitation settings in Table 1 and Table 3 and adjusting base voltage V1 for Table 1 and base voltage V2 for Table 3, as shown in Table 4, $E_1$ in any direction and with any strength can be generated, and on-axis components of electric fields with respect to the number of pole electrodes are the same as Table 2. Furthermore, as shown in Table 2, some of the higher order components of the electric fields may be eliminated by using the deflectors with higher numbers of pole electrodes.

TABLE 1

|  | e1 | e2 | e3 | e4 | e5 | e6 | e7 | e8 | e9 | e10 | e11 | e12 |
|---|---|---|---|---|---|---|---|---|---|---|---|---|
| 4-pole | 1 | 0 | −1 | 0 |  |  |  |  |  |  |  |  |
| 6-pole | 1 | 0.5 | −0.5 | −1 | −0.5 | 0.5 |  |  |  |  |  |  |
| 8-pole | 1 | 0.4142 | 0.4142 | −1 | −1 | −0.4142 | −0.4142 | 1 |  |  |  |  |
| 10-pole | 1 | 0.8090 | 0.3090 | −0.3090 | −0.8090 | −1 | 0.8090 | −0.3090 | −0.3090 | 0.8090 |  |  |
| 12-pole | 1 | 0.7321 | 0.2679 | −0.2679 | −0.7321 | −1 | −1 | −0.7321 | −0.2679 | 0.2679 | 0.7321 | 1 |

TABLE 2

|  | d1 *($\pi R$) | d3 *($3R^2$) | d5 *($5R^4$) | d7 *($7R^6$) | d9 *($9R^8$) | d11 *($11R^{10}$) | d13 *($13R^{12}$) | d15 *($15R^{14}$) | d17 *($17R^{16}$) |
|---|---|---|---|---|---|---|---|---|---|
| 4-pole | −2.8284 | d1 | −d1 | −d1 | d1 | d1 | −d1 | −d1 | d1 |
| 6-pole | −3 | 0 | d1 | −d1 | 0 | −d1 | d1 | 0 | d1 |
| 8-pole | −3.3137 | 0 | 0 | −d1 | d1 | 0 | 0 | −d1 | d1 |
| 10-pole | −3.0902 | 0 | 0 | 0 | d1 | −d1 | 0 | 0 | 0 |
| 12-pole | −3.2154 | 0 | 0 | 0 | 0 | −d1 | d1 | 0 | 0 |

TABLE 3

|  | e1 | e2 | e3 | e4 | e5 | e6 | e7 | e8 | e9 | e10 | e11 | e12 |
|---|---|---|---|---|---|---|---|---|---|---|---|---|
| 4-pole | 0 | 1 | 0 | −1 |  |  |  |  |  |  |  |  |
| 6-pole | 0.5 | 1 | 0.5 | −0.5 | −1 | −0.5 |  |  |  |  |  |  |
| 8-pole | 0.4142 | 1 | 1 | 0.4142 | −0.4142 | −1 | −1 | −0.4142 |  |  |  |  |
| 10-pole | 0.3090 | 0.8090 | 1 | 0.8090 | 0.3090 | −0.3090 | −0.8090 | −1 | −0.8090 | −0.3090 |  |  |
| 12-pole | 0.2679 | 0.7321 | 1 | 1 | 0.7321 | 0.2679 | 0.2679 | −0.7321 | −1 | −1 | −0.7321 | −0.2679 |

TABLE 4

|  | 4-pole | 6-pole | 8-pole | 10-pole | 12-pole |
|---|---|---|---|---|---|
| e1 |  |  | 0.4142 * | 0.3090 * | (0.2679 * |
| e2 | (0 * V1) + (1 * V$_2$) | (0.5 * V$_1$) + (1 *) | (0.4142 * | (0.8090 * | (0.7321 * 0.8090 * |
| e3 | (−1 * V$_1$) + (0 * V$_2$) | (−0.5 * V$_1$) + (0.5 * V$_2$) | (−0.4142 * V$_1$) + (1 * V$_2$) | (0.3090 * V$_1$) + (1 * V$_2$) | (0.2679 * V$_1$) + (1 * V$_2$) |
| e4 | (0 * V1) + (−1 * V$_2$) | (−1 * V$_1$) + (−0.5 * V$_2$) | (−1 * V$_1$) + (0.4142 * V$_2$) | (−0.3090 * V$_1$) + (0.8090 * V$_2$) | (−0.2679 * V$_1$) + (1 * V$_2$) |
| e5 |  | (−0.5 * V$_1$) + (−1 * V$_2$) | (−1 * V$_1$) + (−0.4142 * V$_2$) | (−0.8090 * V$_1$) + (0.3090 * V$_2$) | (−0.7321 * V$_1$) + (0.7321 * V$_2$) |
| e6 |  | (0.5 * V$_1$) + (−0.5 * V$_2$) | (−0.4142 * V$_1$) + (−1 * V$_2$) | (−1 * V$_1$) + (−0.3090 * V$_2$) | (−1 * V$_1$) + (0.2679 * V$_2$) |
| e7 |  |  | (0.4142 * V$_1$) + (−1 * V$_2$) | (−0.8090 * V$_1$) + (−0.8090 * V$_2$) | (−1 * V$_1$) + (−0.2679 * V$_2$) |
| e8 |  |  | (1 * V$_1$) + (−0.4142 * V$_2$) | (−0.3090 * V$_1$) + (−1 * V$_2$) | (−0.7321 * V$_1$) + (−0.7321 * V$_2$) |
| e9 |  |  |  | (0.3090 * V$_1$) + (−0.8090 * V$_2$) | (−0.2679 * V$_1$) + (−1 * V$_2$) |
| e10 |  |  |  | (0.8090 * V$_1$) + (−0.3090 * V$_2$) | (0.2679 * V$_1$) + (−1 * V$_2$) |
| e11 |  |  |  |  | (0.7321 * V$_1$) + (−0.7321 * V$_2$) |
| e12 |  |  |  |  | (1 * V$_1$) + (−0.2679 * V$_2$) |

For example, as shown in Table 2, a 4-equal-pole deflector has all the higher order components $d_{2n+1}$. In contrast, a 6-equal-pole deflector does not have some of the higher order components (e.g., $d_3$, $d_9$, and $d_{15}$). With a 12-equal-pole deflector, many higher order components disappear (e.g., $d_3$, $d_5$, $d_7$, $d_9$, $d_{15}$, and $d_{17}$). In general, the higher order components become zero in a period dependent on the pole number of the deflector. For example, order k of zero component depends on pole number (P=4+2p) as shown in equation (3) below:

$$K=1+2i+n(4+2p) \qquad (3);$$

where p, n, and i are integers, i=1, 2, . . . p, and n=0, 1, 2, . . . ∞. In some embodiments, the micro-deflectors further away from the optical axis of the apparatus (e.g., optical axis 304 of FIG. 3A) may be configured to have a higher number of pole electrodes than the micro-deflectors close to the optical axis to reduce more high order on-axis components.

For the non-zero component $d_k$, the corresponding electric field $E_k(r, \theta)$ changes with k−1 power number of the ratio of radial position r and inner radius R of the deflector as well as the first component d1. Therefore, Ek can be reduced by reducing the ratio. In some embodiments, the micro-deflectors further away from the optical axis of the apparatus (e.g., optical axis 304 of FIG. 3A) may be configured to have a larger inner radius than the micro-deflectors close to the axis to reduce the non-zero electric fields Ek.

Figure 6A:
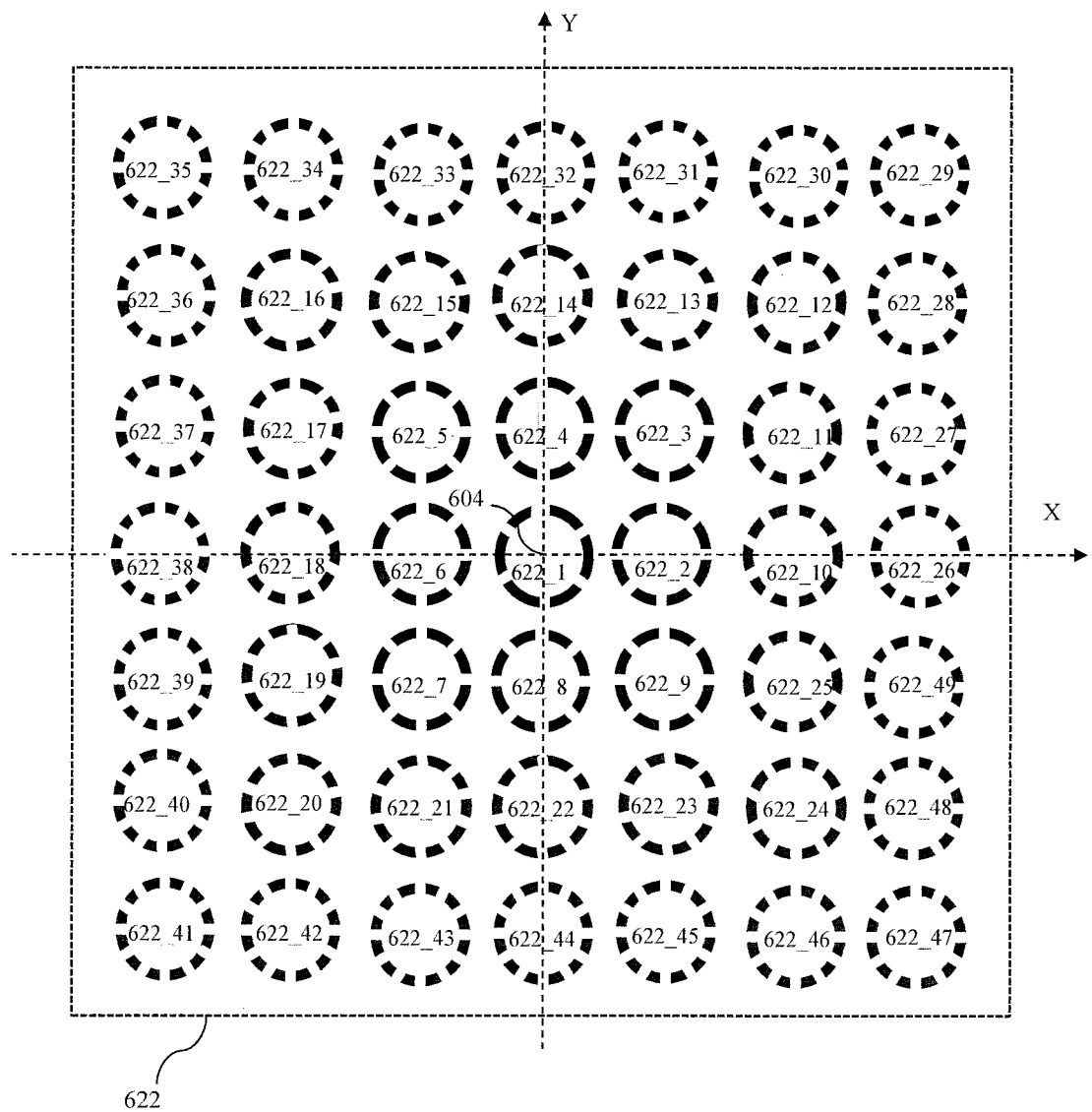
FIG. 6A is a schematic diagram of exemplary multipole structure array, consistent with embodiments of the present disclosure.
Figure 6B:
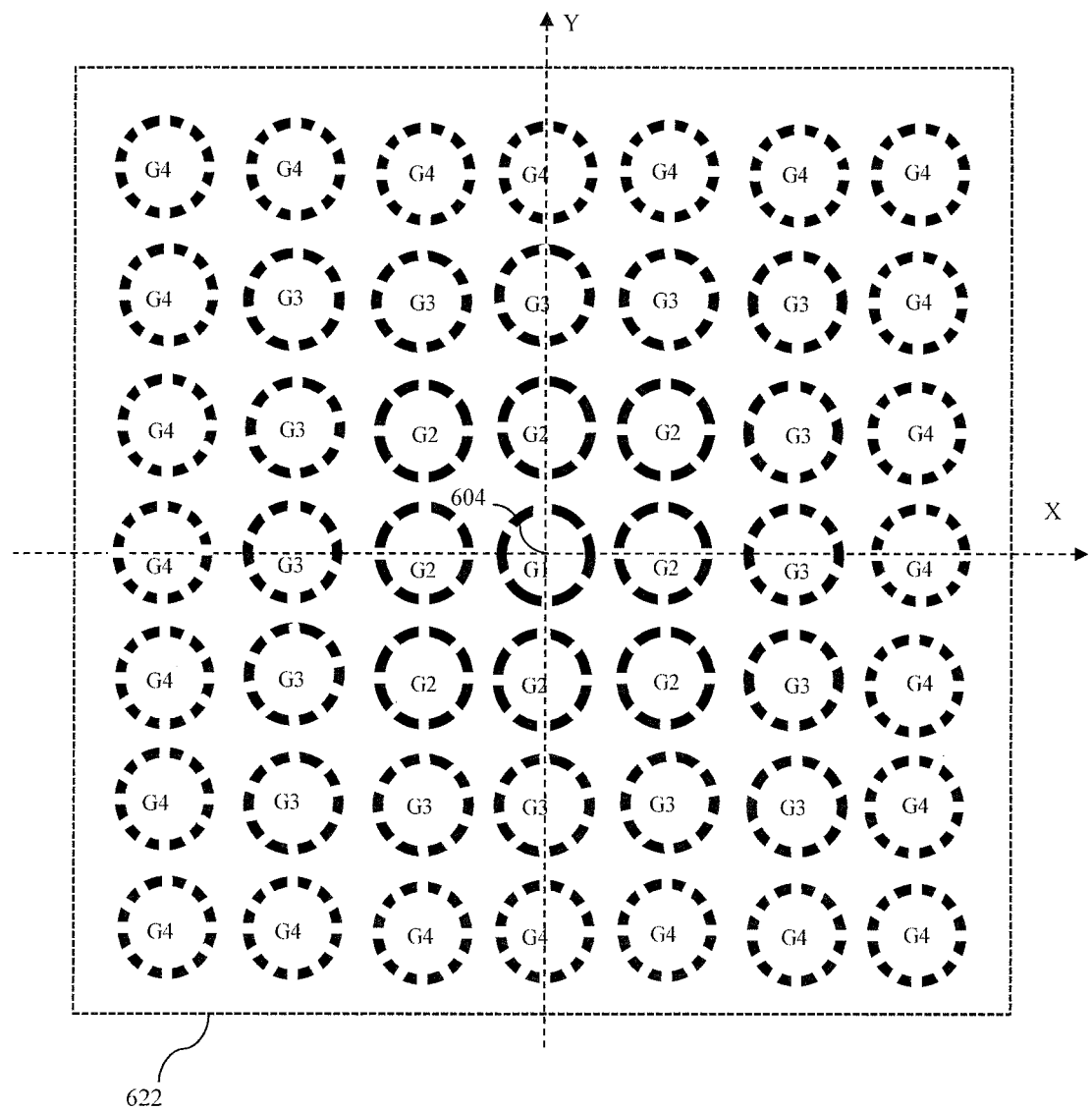
FIG. 6B schematically illustrates grouping of multipole structures of the exemplary multipole structure array of FIG. 6A, consistent with embodiments of the present disclosure.
Figure 6C:
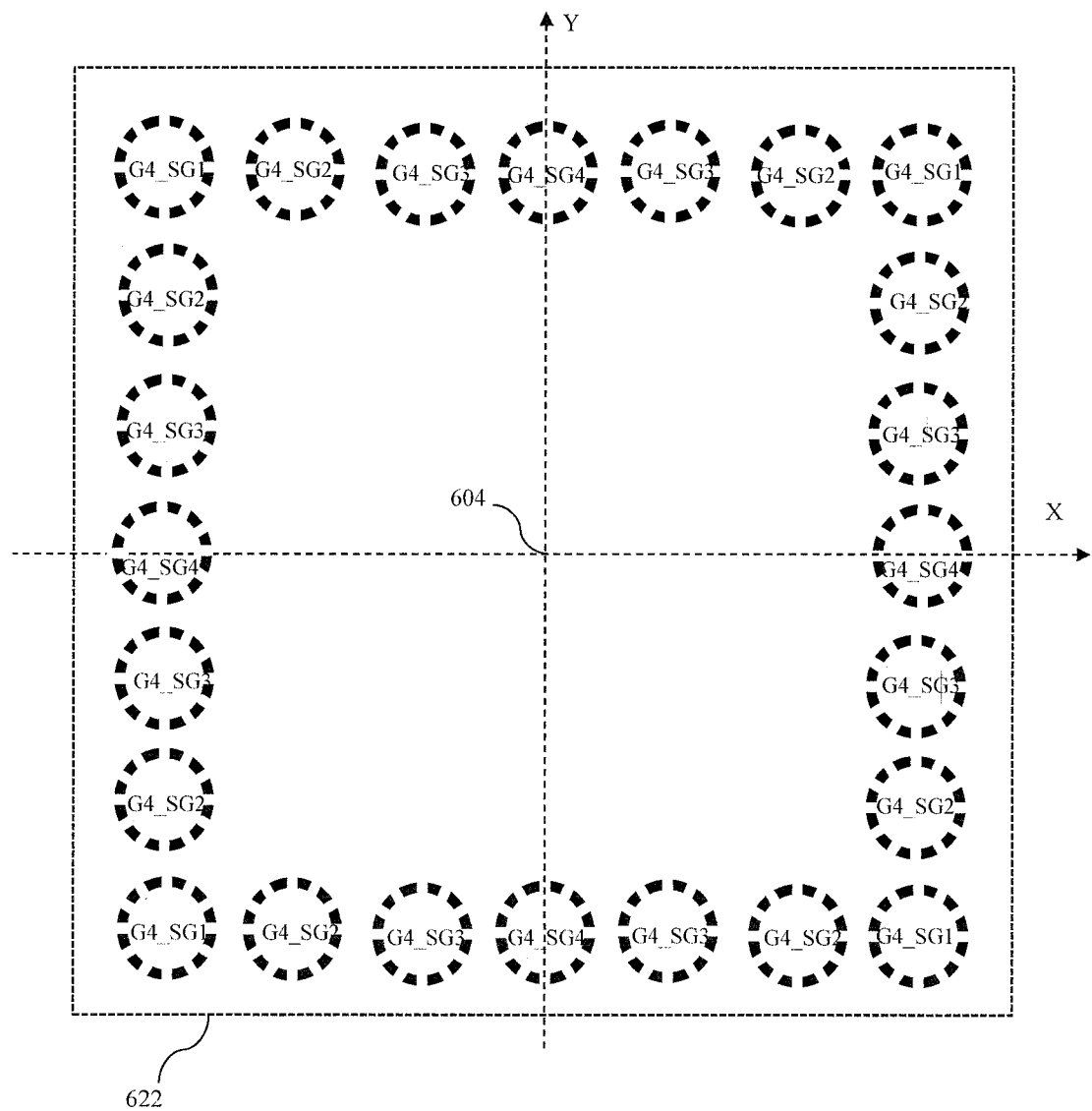
FIG. 6C schematically illustrates subgrouping of a group shown in FIG. 6B, consistent with embodiments of the present disclosure.

Reference is now made to FIGS. 6A, 6B, and 6C, which are schematic diagrams of exemplary multipole structure array 622, consistent with embodiments of the present disclosure. Multipole structure array 622 may be the part of a source conversion unit (such as source conversion unit 320 of FIG. 3A). In particular, multipole structure array 622 may be an image-forming element array (such as image-forming element array 322 of FIG. 3A) or a pre-bending micro-deflector array (such as pre-bending micro-deflector array 323 of FIG. 3A). In some embodiments, multipole structure array 622 may comprise a plurality of micro-deflectors 622_1-622_49. With this 7×7 array configuration, forty-nine charged particle beams (e.g., electron beams) may be simultaneously deflected to form probe spots on the sample surface. In some embodiments, the center axis of the micro-deflector that is located in the middle of the array (e.g., micro-deflector 622_1) may be aligned with optical axis 604 of the inspection apparatus (such as optical axis 304 of FIG. 3A). While FIGS. 6A, 6B, and 6C show an embodiment of multipole structure array with a 7×7 configuration, it is appreciated that the array may be any size.

Some of forty-nine micro-deflectors 622_1-622_49 are located on the outer portion of the array structure and are further away from optical axis 604 than others, thereby having larger radial shifts. For example, the micro-deflectors at the four corners (i.e., micro-deflectors 622_29, 622_35, 622_41, and 622_47) are located the farthest away from optical axis 604 and may have to generate the largest deflection angles. Moreover, when moving right along the X axis from micro-deflector 622_1 to micro-deflector 622_26, the corresponding radial shifts (distance from optical axis 604) increase.

To reduce the higher order components of electric fields generated by these outer micro-deflectors, and thus to reduce the resulting deflection aberrations and non-uniformity of the corresponding probe spots, micro-deflectors with a higher number of pole electrodes may be used to deflect the corresponding beams. In addition, the inner radii R of micro-deflectors with larger radial shifts may be larger than those with smaller radial shifts. Accordingly, moving along the X axis as shown in the FIG. 6A, micro-deflector 622_1 may comprise six poles, micro-deflector 622_2 may comprise eight poles, micro-deflector 622_10 may comprise ten poles, and micro-deflector 622_26 may comprise twelve poles. In some embodiments, the inner radius R of micro-deflector 622_2 may be larger than micro-deflector 622_1, the inner radius R of micro-deflector 622_10 may be larger than micro-deflector 622_2, and the inner radius R of micro-deflector 622_26 may be larger than micro-deflector 622_10.

FIG. 6B illustrates an exemplary grouping of micro-deflectors based on proximity of radial shift from the optical axis. For example, the micro-deflectors having radial shift differences within a <50% range may be classified into one group. In some embodiments, all micro-deflectors of a group may use the same type of micro-deflectors. For example, group 1 (annotated as G1 in FIG. 6B) comprises the micro-deflector in the middle of the array (e.g., micro-deflector 622_1), which may comprise a 6-pole micro-deflector. Group 2 (annotated as G2 in FIG. 6B) comprises eight micro-deflectors surrounding group 1 (e.g., micro-deflectors 622_2-622_9), which may comprise 8-pole micro-deflectors. Group 3 (annotated as G3 in FIG. 6B) comprises sixteen micro-deflectors surrounding group 2 (e.g., micro-deflectors 622_10-622_25), which may use 10-pole micro-deflectors. Group 4 (annotated as G4 in FIG. 6B) comprises twenty-four micro-deflectors surrounding group 4 (e.g., micro-deflectors 622_26-622_49), which may comprise 12-pole micro-deflectors.

Even though, in FIG. 6B, different groups comprise micro-deflectors with different number of poles, it is appreciated that some differing groups may comprise micro-deflectors with the same number of poles. For example, in some embodiments, micro-deflectors in group 1 and group 2 (e.g., micro-deflectors 622_1-622_9) may all use 6-pole micro-deflectors, if the differences of deflection aberrations are within an acceptable range between group 1 and group 2. In such embodiment, group 3 and group 4 may use micro-deflectors with higher number of poles, such as 8 poles, 10 poles, 12 poles, or higher.

As described earlier with respect to FIG. 6A, for those micro-deflectors with the same radial shifts from optical axis 604 of the apparatus, such as the micro-deflectors at the four corners (i.e., micro-deflectors 622_29, 622-35, 622_41, and 622_47), the deflection angles for the corresponding beams may be equal or substantially equal. Furthermore, those micro-deflectors with the same deflection angles may be configured to have the same orientation angles. Accordingly, in multipole structure array 622, a group of multi-pole deflectors having same or substantially same radial shifts and same or substantially same orientation angles may be grouped to share a common driver (which performs various control functions, e.g., generating excitation voltages for each electrode, controlling deflection characteristics, and driving the control signals to micro-deflectors). By sharing a common driver for a plurality of micro-deflectors that are configured to deflect the corresponding beams with the same deflection angles, the number of connecting circuits in the array configuration may be reduced because a common set of voltages can be routed to all micro-deflectors in the group. Examples of the driver sharing technique can be found in U.S. Application No. 62/665,451, which is incorporated by reference in its entirety.

FIG. 6C illustrates an exemplary subgrouping of a group of micro-deflectors based on the desired deflection angles. Among the micro-deflectors of group 4, the micro-deflectors having same or substantially same radial shift may be sub-grouped together and share a common driver. For example, four micro-deflectors annotated as G4_SG1 (the ones at the corners) may be grouped together as sub-group 1. Similarly, eight micro-deflectors annotated as G4_SG2 (neighbors of sub-group 1) may be grouped together as sub-group 2; eight micro-deflectors annotated as G4_SG3 (neighbors of sub-group 2) may be grouped together as sub-group 3; and four micro-deflectors annotated as G4_SG4 (the ones on the X axis or the Y axis) may be grouped together as sub-group 4. Because the micro-deflectors in each sub-group have the same or substantially the same radial shift (and thus having the same deflection angles) and have the same number of poles, those micro-deflectors in the sub-group may be connected to a common driver.

Figure 7A:
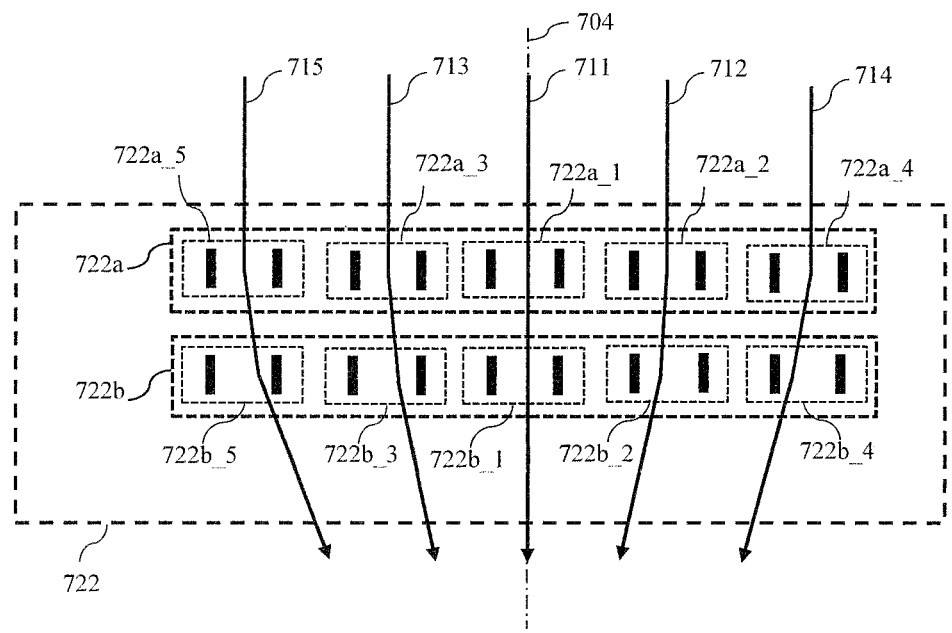
FIG. 7A is a schematic diagram of exemplary multipole structure array with multiple layers, consistent with embodiments of the present disclosure.

Reference is now made to FIG. 7A, which is a schematic diagram of an exemplary multipole structure array 722 with multiple layers, consistent with embodiments of the present disclosure. Multipole structure array 722 may be the part of a source conversion unit (such as source conversion unit 320 of FIG. 3A). In particular, multipole structure array 722 may function as an image-forming element array (such as image-forming element array 322 of FIG. 3A) or a pre-bending micro-deflector array (such as pre-bending micro-deflector array 323 of FIG. 3A).

In some embodiments, multipole structure array 722 may comprise a plurality of layers of multipole structures, such as layer 722a and 722b, and each layer may comprise a plurality of multipole structures (e.g., micro-deflectors). For example, layer 722a may comprise micro-deflectors 722a_1-722a_5. Similarly, layer 722b may comprise micro-deflectors 722b_1-722b_5. In some embodiments, the center of the layers may be aligned with an optical axis 704 of the apparatus. The center of the micro-deflector in the middle of each layer (e.g., 722a_1 and 722b_1) may be aligned with optical axis 704.

In some embodiments, a pair of micro-deflectors, one from each layer, may be aligned together and deflect a corresponding beam. For example, both 722a_1 and 722b_1 may deflect beam 711. Similarly, both 722a_2 and 722b_2 may deflect beam 712; both 722a_3 and 722b_3 may deflect beam 713; both 722a_4 and 722b_4 may deflect beam 714; and both 722a_5 and 722b_5 may deflect beam 715. In a multi-layer configuration, because a pair of micro-deflectors deflect a single beam in series, the desired deflection angle for each micro-deflector may be smaller than in a single-layer configuration.

In some embodiments, the pair of micro-deflectors may use the same type of micro-deflector having the same number of poles. For example, micro-deflectors 722a_1 and 722b_1 may both comprise 8-pole micro-deflectors. In other embodiments, the pair of micro-deflectors may use different types of micro-deflectors. For example, micro-deflector 722a_4 may use a 12-pole micro-deflector, while micro-deflector 722b_4 may use a 10-pole micro-deflector.

Figure 7B:
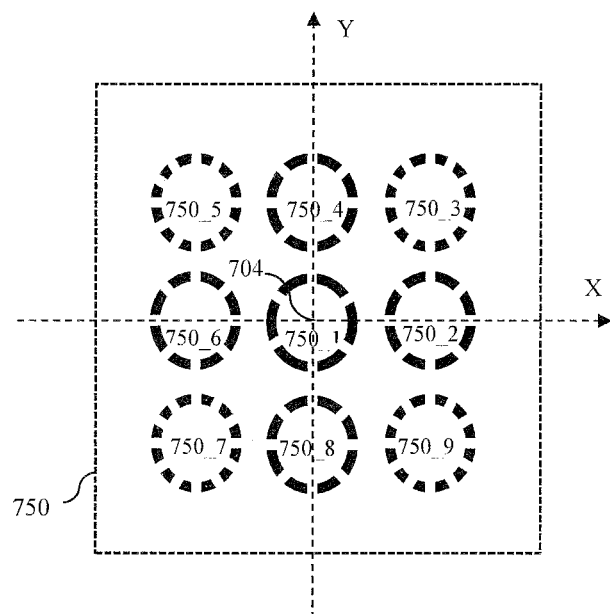
FIG. 7B is a schematic diagram of an exemplary layer of multipole structure array of FIG. 7A, consistent with embodiments of the present disclosure.

Reference is now made to FIG. 7B, which is a schematic diagram of an exemplary layer of multipole structure array of FIG. 7A, consistent with embodiments of the present disclosure. As the number of beams increases, the size of the multipole structure array increases as well. In a large array of micro-deflectors, therefore, some of beams would be located further away from the optical axis (e.g., optical axis 304 of FIG. 3A) of the apparatus. The deflection angles of micro-deflectors located at the outer edge of the array also increase accordingly. Because of the large deflection angles, the beams deflected by these micro-deflectors located at the outer edge may suffer with higher deflection aberrations, thereby increasing the size and non-uniformity of the corresponding probe spots. As described with respect to FIG. 6A, in order to reduce the higher order components of electric fields generated by these micro-deflectors (thereby reducing the resulting deflection aberration and non-uniformity of the corresponding probe spots), micro-deflectors with a higher number of pole electrodes may be used to deflect the corresponding beams. The same approach may be utilized for a multi-layer micro-deflector array as well.

FIG. 7B shows an example of a 3×3 micro-deflector array, consistent with embodiments of the present disclosure. The array can be a layer of a multi-layer micro-deflector array, such as layer 722a or 722b of array 722 of FIG. 7A. Nine micro-deflectors 750_1-750_9 may be grouped based on radial shift, as described with respect to FIGS. 6A and 6B. For example, a first group may comprise micro-deflector 750_1, which has the lowest radial shift among nine micro-deflectors. A second group may include the micro-deflectors on the X and Y axis (e.g., micro-deflectors 750_2, 750_4, 750_6, 750_8), which have higher radial shifts than the first group (e.g., micro-deflector 750_1). A third group may include the micro-deflectors at the four corners (e.g., micro-deflectors 750_3, 750_5, 750_7, 750_9), which have the largest radial shifts from optical axis 704. Accordingly, the first group (micro-deflector 751_1), the second group (micro-deflectors 750_2, 750_4, 750_6, 750_8), and the third group (micro-deflectors 750_3, 750_5, 750_7, 750_9) may comprise 6-pole micro-deflector, 8-pole micro-deflectors, and 12-pole micro-deflectors, respectively, to reduce higher order components of electric fields, thereby reducing the resulting deflection aberrations and non-uniformity of the corresponding probe spots. While FIG. 7B shows a 3×3 array configuration, it is appreciated that the array may be any size. Furthermore, while FIG. 7B shows three groups each having different types of micro-deflectors, it is appreciated that the array may comprise any combination of groups and types of micro-deflectors.

Furthermore, the driver sharing technique described with respect to FIG. 6C may also apply to multi-layer micro-deflector array. For example, the first group (micro-deflector 750_1) may be connected and driven by a first driver. Similarly, all micro-deflectors in the second group (micro-deflectors 750_2, 750_4, 750_6, 750_8) may be connected and driven by a second driver, because those micro-deflectors have the same deflection angles. Similarly, all micro-deflectors in the third group (micro-deflectors 750_3, 750_5, 750_7, 750_9) may be connected and driven by a third driver.

Figure 8A:
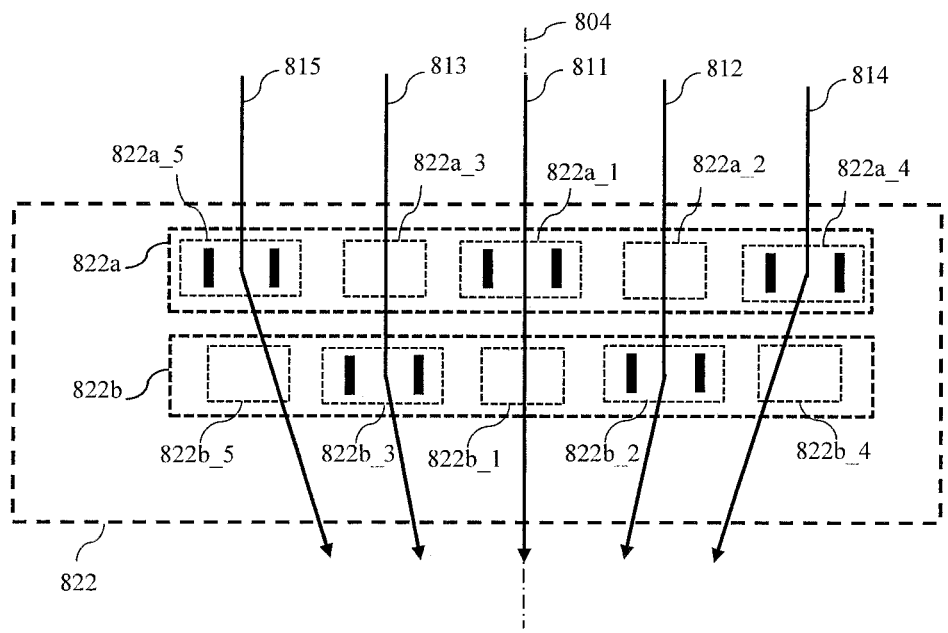
FIGS. 8A and 8B are schematic diagrams of an exemplary multipole structure array with multiple layers, consistent with embodiments of the present disclosure.
Figure 8B:
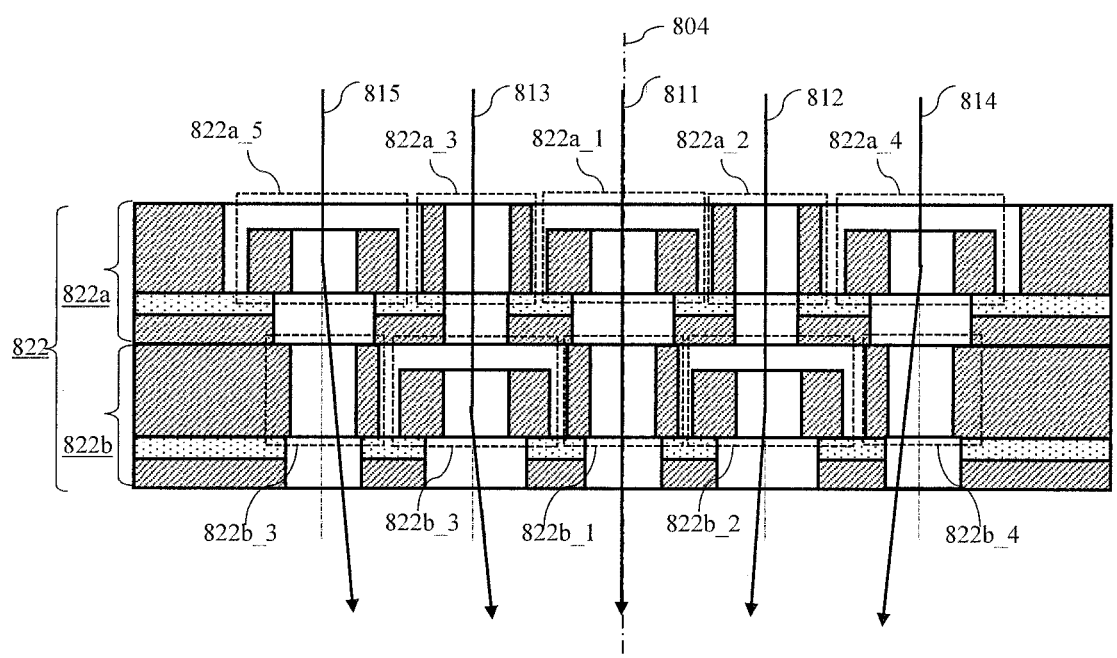

Reference is now made to FIGS. 8A and 8B, which are schematic diagrams of an exemplary multipole structure array with multiple layers, consistent with embodiments of the present disclosure. Multipole structure array 822 may be the part of a source conversion unit (such as source conversion unit 320 of FIG. 3A). In particular, multipole structure array 822 may function as an image-forming element array (such as image-forming element array 322 of FIG. 3A) or a pre-bending micro-deflector array (such as pre-bending micro-deflector array 323 of FIG. 3A).

In some embodiments with a plurality of micro-deflectors, some of the particle beams may be deflected by micro-deflectors in one layer, while the other particle beams may be deflected by micro-deflectors in another layer. For example, beams 811, 814, and 815 may be deflected by micro-deflector 822a_1, 822a_4, and 822a_5 of layer 822a, while beams 812 and 813 may be deflected by micro-deflectors 822b_2 and 822b_3 of layer 822b. By placing some of the micro-deflectors in one layer and the other micro-deflectors in another layer, circuits connecting the poles in each layer may be reduced in comparison with packing the full set of micro-deflectors into one layer. This, therefore, may improve electrical safety and also reduce complexity of design and manufacturing process of the multipole structure array.

In some embodiments, layers 822*a* and 822*b* may include beam path holes 822*a*_2, 822*a*_3, 822*b*_1, 822*b*_4, and 822*b*_5, which let beams pass through without deflection. As shown in FIG. 8B, because beam path holes are narrower than micro-deflectors (e.g., the width of beam path hole 822*a*_3 is narrower than the width of micro-deflector 822*a*_1), the overall width of array 822 may be reduced by placing micro-deflectors in alternating fashion as shown in FIGS. 8A and 8B.

Figure 8C:
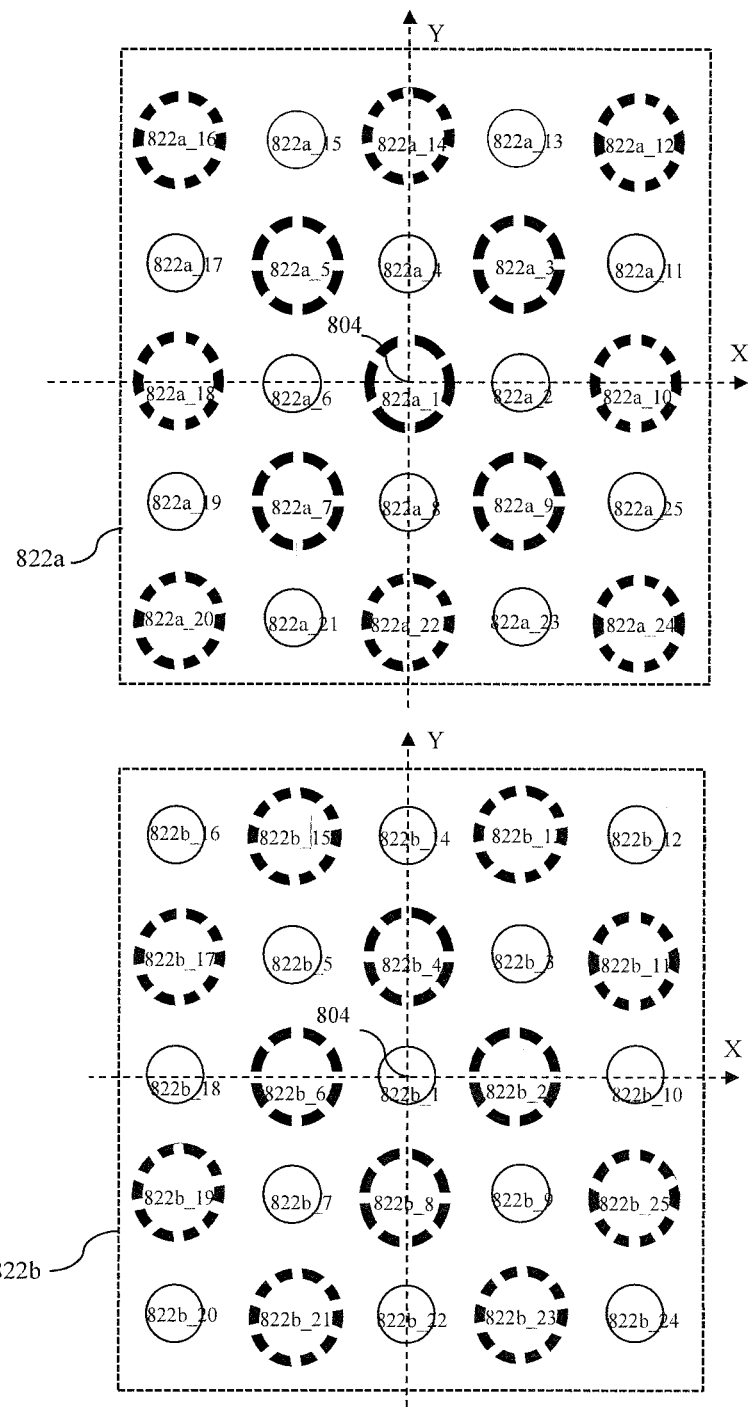
FIGS. 8C, 8D and 8E are schematic diagrams of exemplary layers of multipole structure array of FIG. 8A, consistent with embodiments of the present disclosure.
Figure 8D:
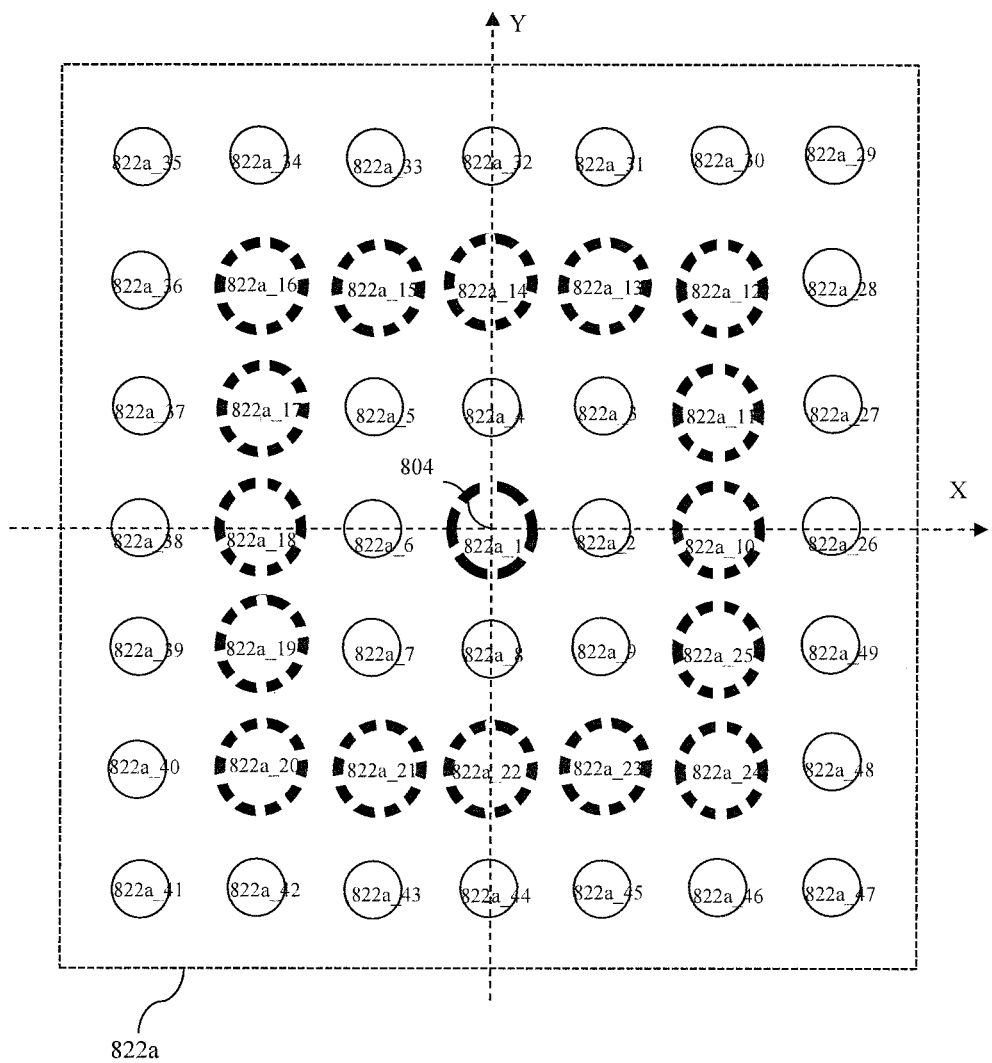
Figure 8E:
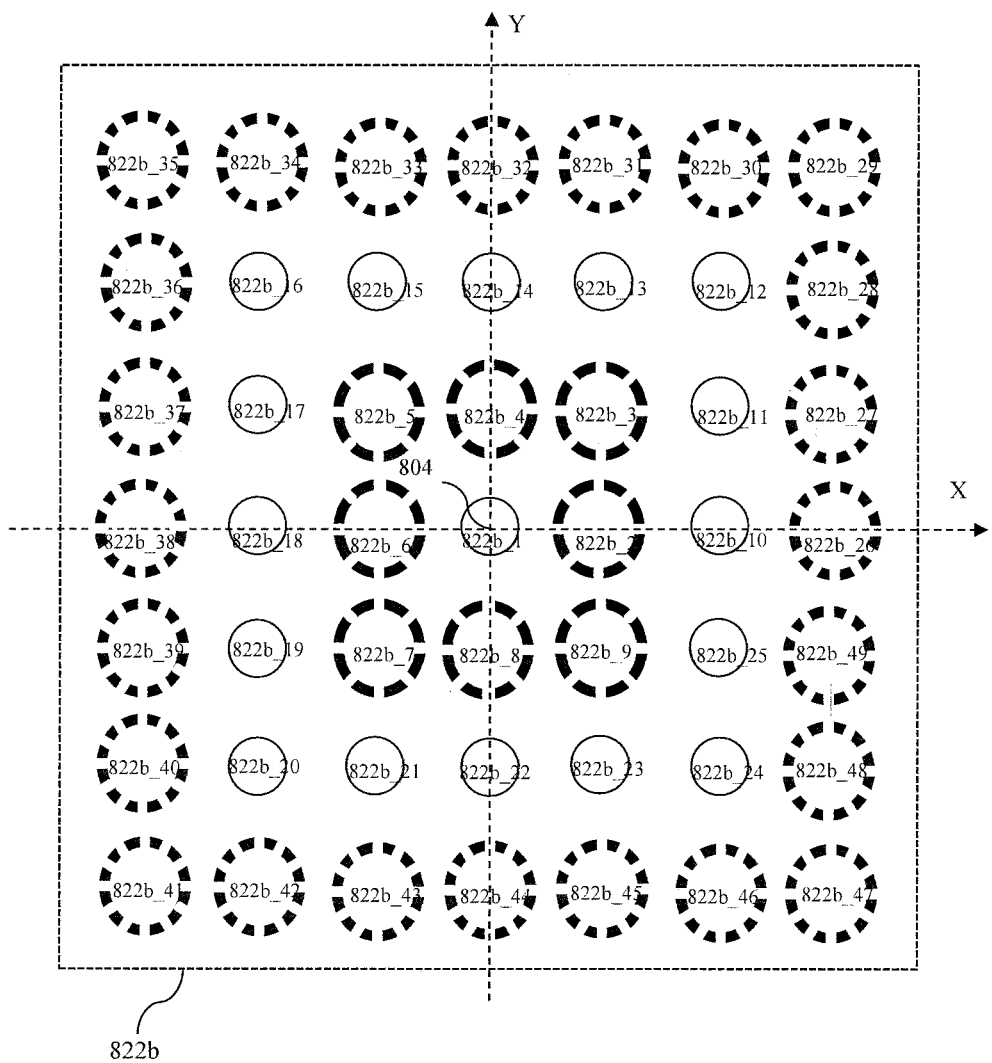

Reference is now made to FIGS. 8C, 8D, and 8E, which illustrate schematic diagrams of exemplary layers that can be used within multipole structure array 822 of FIG. 8A, consistent with embodiments of the present disclosure. As the number of beams increases, the size of the multipole structure array increases as well. In a large array of micro-deflectors, therefore, some beams are located further away from the optical axis (e.g., optical axis 304 of FIG. 3A) of the apparatus. The deflection angles of micro-deflectors located at the outer edge of structure array 822 also increases accordingly. Because of the large deflection angles, the beams deflected by these micro-deflectors located at the outer edge may suffer with higher deflection aberrations, thereby increasing the size and non-uniformity of the corresponding probe spots. As described with respect to FIG. 6A, in order to reduce higher order components of electric fields generated by these micro-deflectors, thereby reducing the resulting deflection aberrations and non-uniformity of the corresponding probe spots, micro-deflectors with a higher number of pole electrodes may be used to deflect the corresponding beams. The same approach may be utilized for multi-layer micro-deflector array, like array 822 of FIG. 8A, as well.

FIG. 8C shows an exemplary pair of micro-deflector array layers that can simultaneously deflect 25 particle beams (5×5 configuration). In this embodiment, micro-deflectors (such as micro-deflector 822*a*_1, 822*a*_4, 822*a*_5 of FIG. 8B) and beam path holes (such as beam path holes 822*a*_2 and 822*a*_3 of FIG. 8B) are arranged alternatively in each layer, in such a way that one particle beam is deflected by a micro-deflector in only one layer. For example, layer 822*a* comprises micro-deflectors 822*a*_1, 822*a*_3, 822*a*_5, 822*a*_7, 822*a*_9, 822*a*_10, 822*a*_12, 822*a*_14, 822*a*_16, 822*a*_18, 822*a*_20, 822*a*_22, 822*a*_24, and beam path holes 822*a*_2, 822*a*_4, 822*a*_6, 822*a*_8, 822*a*_11, 822*a*_13, 822*a*_15, 822*a*_17, 822*a*_19, 822*a*_21, 822*a*_23, 822*a*_25. Similarly, layer 822*b* comprises micro-deflectors 822*b*_2, 822*b*_4, 822*b*_6, 822*b*_8, 822*b*_11, 822*b*_13, 822*b*_15, 822*b*_17, 822*b*_19, 822*b*_21, 822*b*_23, 822*b*_25, and beam path holes 822*b*_1, 822*b*_3, 822*b*_5, 822*b*_7, 822*b*_9, 822*b*_10, 822*b*_12, 822*b*_14, 822*b*_16, 822*b*_18, 822*b*_20, 822*b*_22, 822*b*_24. Accordingly, 13 of 25 beams are deflected by micro-deflectors of layer 822*a*, while the remaining 12 beams are deflected by micro-deflectors of layer 822*b*.

Like previous embodiments, micro-deflectors with the same or similar radial shifts (e.g., radial shift differences within a <50% range may be grouped together and have a certain number of pole electrodes to reduce the deflection aberrations. For example, in layer 822*a*, micro-deflector 822*a*_1 is a 6-pole micro-deflector, micro-deflectors 822*a*_3, 822*a*_5, 822*a*_7, and 822*a*_9 are 8-pole micro-deflectors, and micro-deflectors 822*a*_10, 822*a*_12, 822*a*_14, 822*a*_16, 822*a*_18, 822*a*_20, 822*a*_22, and 822*a*_24 are 10-pole micro-deflectors. Similarly, in layer 822*b*, micro-deflectors 822*b*_2, 822*b*_4, 822*b*_6, and 822*b*_8 are 8-pole micro-deflectors, and micro-deflectors 822*b*_11, 822*b*_13, 822*b*_15, 822*b*_17, 822*b*_19, 822*b*_21, 822*b*_23, and 822*b*_25 are 10-pole micro-deflectors. While FIG. 8C shows a 5×5 array configuration, it is appreciated that the array may be any size. Also, it is appreciated that the array configuration may comprise any combination of groups and types of micro-deflectors.

Furthermore, the driver sharing technique described with respect to FIGS. 6C and 7B may also apply to this embodiment. In layer 822*b*, for example, all micro-deflectors in a first group (micro-deflector 822*b*_2, 822*b*_4, 822*b*_6, 822*b*_8) may be connected and driven by a first driver, because those micro-deflectors have the same deflection angle and the same numbers of pole electrodes. Similarly, all micro-deflectors in a second group (micro-deflectors 822*b*_11, 822*b*_13, 822*b*_15, 822*b*_17, 822*b*_19, 822*b*_21, 822*b*_23, and 822*b*_25) may be connected and driven by a second driver.

FIGS. 8D and 8E show another embodiment of micro-deflector array layer that can simultaneously deflect forty-nine particle beams (7×7 configuration). In this embodiment, micro-deflectors with a certain number of pole electrodes are placed in one layer. For example, all micro-deflector with six poles or ten poles are placed in layer 822*a* of FIG. 8D, while all micro-deflectors with eight poles and twelve poles are placed in layer 822*b* of FIG. 8E. Among the total of forty-nine beams, seventeen beams are deflected by layer 822*a*, and the remaining thirty-two beams are deflected by layer 822*b*. In layer 822*a*, a first group includes micro-deflector 822*a*_1 in the middle, which may comprise six poles. A second group includes micro-deflectors 822*a*_10-822*a*_25, which may comprise ten poles. Similarly, in layer 822*b*, a third group includes micro-deflectors 822*b*_2-822*b*_9, which may comprise eight poles. A fourth group includes micro-deflectors 822*b*_26-822*b*_49, which may comprise twelve poles. Furthermore, the driver sharing technique described with respect to FIGS. 6C and 7B may also apply to this embodiment. For example, in the layer 822*b* of FIG. 8E, the four micro-deflectors in the third group that are positioned on one of the X- or Y-axis (e.g., micro-deflector 822*b*_2, 822*b*_4, 822*b*_6, 822*b*_8) may be connected and driven by one common driver, because those micro-deflectors have the same deflection angles, same orientation angles, and the same numbers of pole electrodes. Similarly, the other four micro-deflectors in the third group that are positioned on the corners (e.g., micro-deflector 822*b*_3, 822*b*_5, 822*b*_7, 822*b*_9) may be connected and driven by another common driver.

Figure 9:
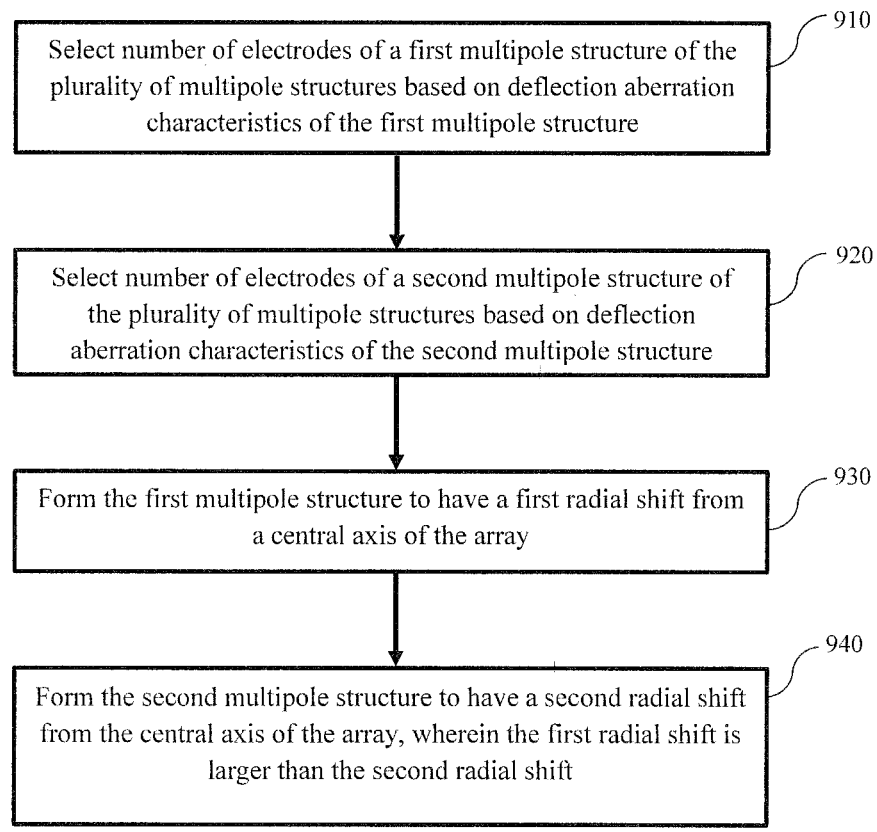
FIG. 9 is a flow chart illustrating an exemplary method of manufacturing an exemplary configuration of a multipole structure array, consistent with embodiments of the present disclosure.

Reference is now made to FIG. 9, which is a flow chart illustrating an exemplary method of manufacturing an exemplary configuration of a multipole structure array, consistent with embodiments of the present disclosure. In some embodiments, the multipole structure array may be manufactured using a semiconductor fabrication process. In some embodiments, the multipole structure array may comprise a micro-deflector array, such as micro-deflector array 622 of FIG. 6A. In some embodiments, the multipole structure array may comprise a plurality of micro-deflectors, such as micro-deflectors 622_1-622_49 of FIG. 6A. To reduce the higher order components of electric fields generated by the micro-deflectors, thereby reducing the resulting deflection aberrations and non-uniformity of the corresponding probe spots, micro-deflectors with higher number of pole electrodes may be used to deflect the corresponding beams that are further away from an optical axis of an inspection apparatus. For example, a first multipole structure (such as micro-deflector 622_29 of FIG. 6A) having a higher radial shift (i.e., further away from the optical axis) than a second multipole structure (such as micro-deflector 622_3 of FIG. 6A), may comprise a micro-deflector with a higher number of pole electrodes than the second micro-deflector.

In step 910, the number of pole electrodes of the first multipole structure is configured based on deflection aberration characteristic of the first multipole structure. In step 920, the number of pole electrodes of the second multipole structure is configured based on deflection aberration characteristic of the second multipole structure. The number of pole electrodes selected for the second multipole structure in step 920 is less than the number of pole electrodes selected for the first multipole structure in step 910.

In step 930, the first multipole structure is formed at a location with a first radial shift from a central axis of the array. In step 940, the second multipole structure is formed at a location with a second radial shift from a central axis of the array. The distance between the optical axis and the location of the first multipole structure is greater than the distance between the optical axis and the location of the second multipole structure. Accordingly, the first multipole structure has a larger radial shift than the second multipole structure.

It is appreciated that the first and second multipole structures can be part of separate groups of multipole structures as explained above with respect to, for example, FIG. 6B. Moreover, it is appreciated that the first and second multipole structures can be located on separate layers as explained above with respect to, for example, FIG. 8C.

The embodiments may further be described using the following clauses:

1. A micro-structure deflector array including a plurality of multipole structures, each multipole structure comprising a plurality of pole electrodes, the array comprising:
    a first multipole structure of the plurality of multipole structures, the first multipole structure having a first radial shift from a central axis of the array; and
    a second multipole structure of the plurality of multipole structures, the second multipole structure having a second radial shift from the central axis of the array,
    wherein the first radial shift is larger than the second radial shift, and the first multipole structure comprises a greater number of pole electrodes than the second multipole structure.
2. The array of clause 1, wherein the first multipole structure comprises a greater number of pole electrodes than the second multipole structure to reduce deflection aberrations when the plurality of multipole structures deflects a plurality of charged particle beams.
3. The array of any one of clauses 1 and 2, wherein:
    the plurality of pole electrodes of the first multipole structure are electrically connected and driven by a first driver, and
    the plurality of pole electrodes of the second multipole structure are electrically connected and driven by a second driver.
4. The array of clause 3, wherein the first driver and the second driver are configured to enable the first multipole structure and the second multipole structure to function as image-forming elements or pre-bending micro-deflectors in a multi-beam apparatus to deflect the plurality of charged particle beams.
5. The array of any one of clauses 1-4, wherein the first multipole structure has an inner diameter larger than the second multipole structure.
6. A micro-structure deflector array including a plurality of multipole structures, each multipole structure comprising a plurality of pole electrodes, the array comprising:
    a first group of multipole structures of the plurality of multipole structures, the first group of multipole structures having a first set of radial shifts from a central axis of the array, wherein each multipole structure of the first group comprises a same number of corresponding pole electrodes; and
    a second group of multipole structures of the plurality of multipole structures, the second group of multipole structures having a second set of radial shifts from the central axis of the array, wherein each multipole structure of the second group comprises a same number of corresponding pole electrodes,
    wherein the lowest value of radial shift of the first set of radial shifts are higher than the highest value of radial shift of the second set of radial shifts, and a multipole structure of the first group comprises a greater number of pole electrodes than a multipole structure of the second group.
7. The array of clause 6, wherein the multipole structure of the first group comprises a greater number of pole electrodes than the multipole structure of the second group to reduce deflection aberrations when the plurality of multipole structures deflects a plurality of charged particle beams.
8. The array of any one of clauses 6 and 7, wherein the first group or the second group may only comprise one multipole structure.
9. The array of any one of clauses 6-8, wherein the first group of multipole structures of the plurality of multipole structures comprises:
    a first sub-group of multipole structures that are electrically connected and driven by a first driver, wherein the radial shifts and orientation angles of the first sub-group of multipole structures are equal or substantially equal.
10. The array of any one of clauses 6-9, wherein the second group of multipole structures of the plurality of multipole structures comprises:
    a second sub-group of multipole structures that are electrically connected and driven by a second driver, wherein the radial shifts and orientation angles of the second sub-group of multipole structures are equal or substantially equal.
11. The array of any one of clauses 6-10, wherein at least one of the first and second drivers is configured to enable the corresponding multipole structures to function as image-forming elements or pre-bending micro-deflectors in a multi-beam apparatus to deflect the plurality of charged particle beams.
12. The array any one of clauses 6-11, wherein one multipole structure of the first group has an inner diameter larger than one multipole structure of the second group.
13. A micro-structure deflector array including a plurality of multipole structures configured to deflect a plurality of charged particle beams, each multipole structure comprising a plurality of pole electrodes, the array comprising:
    a first layer of multipole structures of the plurality of multipole structures, the first layer comprising a first multipole structure having a first radial shift from a central axis of the array and a second multipole structure having a second radial shift from the central axis of the array, wherein the first radial shift is larger than the second radial shift, and the first multipole structure comprises a greater number of pole electrodes than the second multipole structure; and a second layer of multipole structures of the plurality of multipole structures, the second layer comprising a third multipole structure having a third radial shift from the central axis of the array.

14. The array of clause 13, wherein the first multipole structure comprises a greater number of pole electrodes than the second multipole structure to reduce deflection aberrations of the corresponding charge particle beams.

15. The array of any one of clauses 13 and 14, wherein the third radial shift is smaller than the first radial shift.

16. The array of clause 15, wherein the third radial shift is larger than the second radial shift.

17. The array of any one of clauses 13-16, wherein the number of pole electrodes of the third multipole structure is larger than or equal to the second multipole structure.

18. The array of any one of clauses 13-16, wherein the number of pole electrodes of the third multipole structure is smaller than or equal to the first multipole structure.

19. The array of any one of clauses 13, 14, 16, and 17, wherein the third multipole structure comprises a greater or equal number of pole electrodes than the first multipole structure.

20. The array of any one of clauses 13-19, wherein one of the plurality of charged particle beams is deflected by a multipole structure of the first layer, and another one of the plurality of charged particle beams is deflected by a multipole structure of the second layer.

21. The array of any one of clauses 13-19, wherein one of the plurality of charged particle beams is deflected by a multipole structure of the first layer and a multipole structure of the second layer in series, and the multipole structure of the first layer and the multipole structure of the second layer are aligned each other.

22. The array of any one of clauses 13-19, wherein:
a first beam of the plurality of charged particle beams is deflected by a multipole structure of the first layer,
a second beam of the plurality of charged particle beams is deflected by a multipole structure of the second layer, and
a third beam of the plurality of charged particle beams is deflected by a multipole structure of the first layer and a multipole structure of the second layer in series.

23. The array of any one of clauses 13-22, wherein each multipole structures of the plurality of multipole structures is placed inside an electrically shielding cavity to be electrically shielded from other multipole structures.

24. The array of any one of clauses 13-23, wherein the first multipole structure of the first layer has an inner diameter larger than the second multipole structure of the first layer.

25. The array of any one of clauses 13-24, wherein two or more of multipole structures of the first layers:
have a same number of pole electrodes,
are equal or substantially equal in radial shift and orientation angle, and
are electrically connected and driven by a first driver.

26. The array of any one of clauses 13-25, wherein two or more of multipole structures of the second layers:
have a same number of pole electrodes,
are equal or substantially equal in radial shift and orientation angle, and
are electrically connected and driven by a second driver.

27. A source conversion unit in a charged particle beam system comprising the array of any one of clauses 13-26.

28. A method of manufacturing a micro-structure deflector array including a plurality of multipole structures, each multipole structure comprising a plurality of pole electrodes, the method comprising:
forming the first multipole structure to have a first radial shift from a central axis of the array; and
forming the second multipole structure to have a second radial shift from the central axis of the array, wherein the first radial shift is larger than the second radial shift and the first multipole structure has a different number of pole electrodes from the second multipole structure.

29. The method of clause 28, further comprising selecting the number of pole electrodes of the first multipole structure and the number of pole electrodes of the second multipole structure based on aberration characteristics of the first and second multipole structures.

30. The method of clause 29, wherein selecting the number of pole electrodes of the first multipole structure and the number of pole electrodes of the second multipole structure comprises selecting corresponding numbers of pole electrodes to reduce high-order components of electric fields thereof.

31. The method of any one of clauses 28-30, wherein the number of pole electrodes of the first multipole structure is larger than the second multipole structure.

32. The method of any one of clause 28-31, further comprising placing the plurality of multipole structures in one or more layers.

33. The method of clause 32, wherein one multipole structure in a first layer of the one or more layers is aligned with one multipole structure in a second layer of the one or more layers.

34. The method of any one of clauses 28-33, further comprising grouping a subset of multipole structures to share one driver, wherein the subset of multipole structures:
have a same number of pole electrodes, and
are equal or substantially equal in radial shift and orientation angle.

35. The method of any one of clauses 32-34, further comprising grouping a subset of multipole structures in the first layer of the one or more layers to share a first driver, wherein the subset of multipole structures in the first layer:
have a same number of pole electrodes, and
are equal or substantially equal in radial shift and orientation angle.

36. The method of any one of clauses 32-35, further comprising grouping a subset of multipole structures in the second layer of the one or more layers to share a second driver, wherein the subset of multipole structures in the second layer: have a same number of pole electrodes, and are equal or substantially equal in radial shift and orientation angle.

37. A micro-structure deflector array including a plurality of multipole structures, each multipole structure comprising a plurality of pole electrodes, the array comprising:
a first group of multipole structures of the plurality of multipole structures, the first group of multipole structures having a first set of radial shifts from a central axis of the array, wherein each multipole structure of the first group comprises a same number of corresponding pole electrodes; and
a second group of multipole structures of the plurality of multipole structures, the second group of multipole structures having a second set of radial shifts from the central axis of the array, wherein each multipole structure of the second group comprises a same number of corresponding pole electrodes, wherein a multipole structure of the first group comprises a greater number of pole electrodes than a multipole structure of the second group, and wherein each of the first group and the second group comprises one or more multipole structures.

38. The array of clause 37, wherein a lowest value of radial shift of the first set of radial shifts are higher than a highest value of radial shift of the second set of radial shifts.

39. The array of clause 37, wherein the plurality of multipole structures are configured to substantially simultaneously deflect a plurality of charged particle beams.

40. The array of clause 39, wherein the first group of multipole structures comprises:
   a first sub-group of multipole structures that are electrically connected to, and driven by, a first driver, wherein radial shifts and orientation angles of the first sub-group of multipole structures are substantially equal.

41. The array of clause 40, wherein the second group of multipole structures comprises:
   a second sub-group of multipole structures that are electrically connected to, and driven by, a second driver, wherein radial shifts and orientation angles of the second sub-group of multipole structures are equal or substantially equal.

42. The array of clause 41, wherein one of the first and second drivers is configured to enable corresponding multipole structures to deflect the plurality of charged particle beams in a multi-beam apparatus, and wherein further the plurality of multipole structures are configured as image-forming elements or pre-bending micro-deflectors in the multi-beam apparatus.

43. The array of clause 37, wherein a multipole structure of the first group has an inner diameter larger than a multipole structure of the second group.

44. The array of clause 39, wherein the first group and the second group are arranged in a first layer of the array, and wherein the array further comprises a second layer that comprises a third group of multipole structures having a third radial shift from the central axis of the array.

45. The array of clause 44, wherein the third radial shift is different than the first set of radial shifts or the second set of radial shifts.

46. The array of clause 45, wherein a number of pole electrodes of the third multipole structure is different than, or equal to, a number of pole electrodes of a multipole structure of the first group of multipole structures.

47. The array of clause 45, wherein one of the plurality of charged particle beams is deflected by a multipole structure of the first layer, and another one of the plurality of charged particle beams is deflected by a multipole structure of the second layer.

48. The array of clause 45, wherein one of the plurality of charged particle beams is deflected by a multipole structure of the first layer and a multipole structure of the second layer in series, and the multipole structure of the first layer and the multipole structure of the second layer are aligned to each other.

49. The array of clause 45, wherein:
   a first beam of the plurality of charged particle beams is deflected by a multipole structure of the first layer and is not deflected by any multipole structure of the second layer,
   a second beam of the plurality of charged particle beams is deflected by a multipole structure of the second layer and is not deflected by any multipole structure of the second layer and a third beam of the plurality of charged particle beams is deflected by a multipole structure of the first layer and a multipole structure of the second layer in series.

50. A source conversion unit in a charged particle beam system, wherein the source conversion unit comprises a micro-structure deflector array including a plurality of multipole structures, each of the multipole structures comprising a plurality of pole electrodes, the array comprising:
   a first group of multipole structures of the plurality of multipole structures, the first group of multipole structures having a first set of radial shifts from a central axis of the array, wherein each multipole structure of the first group comprises a same number of pole electrodes; and
   a second group of multipole structures of the plurality of multipole structures, the second group of multipole structures having a second set of radial shifts from the central axis of the array, wherein each multipole structure of the second group comprises a same number of pole electrodes,
   wherein the first set of radial shifts is different from the second set of radial shifts, wherein a multipole structure of the first group comprises a greater number of pole electrodes than a multipole structure of the second group, and wherein each of the first group and the second group comprises one or more multipole structures.

51. The source conversion unit of clause 50, wherein the first group and the second group are arranged in a first layer of the array, the array further comprising a second layer that comprises a third group of multipole structures having a third radial shift from the central axis of the array.

52. The array of any one of clauses 6-10, wherein a driver of the first and second drivers is configured to enable the corresponding multipole structures to function as image-forming elements or pre-bending micro-deflectors in a multi-beam apparatus to deflect the plurality of charged particle beams.

53. The array of clause 52, wherein the driver of the first and second drivers being configured includes all of the first and second drivers being configured.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A micro-structure deflector array including a plurality of multipole structures, each multipole structure comprising a plurality of pole electrodes, the array comprising:
   a first group of multipole structures of the plurality of multipole structures, the first group of multipole structures having a first set of radial shifts from a central axis of the array, wherein each multipole structure of the first group comprises a same number of corresponding pole electrodes; and
   a second group of multipole structures of the plurality of multipole structures, the second group of multipole structures having a second set of radial shifts from the central axis of the array, wherein each multipole structure of the second group comprises a same number of corresponding pole electrodes, wherein a multipole structure of the first group comprises a greater number of pole electrodes than a multipole structure of the second group, and wherein each of the first group and the second group comprises one or more multipole structures.

2. The array of claim 1, wherein a lowest value of radial shift of the first set of radial shifts are higher than a highest value of radial shift of the second set of radial shifts.

3. The array of claim 1, wherein the plurality of multipole structures are configured to substantially simultaneously deflect a plurality of charged particle beams.

4. The array of claim 3, wherein the first group of multipole structures comprises:
a first sub-group of multipole structures that are electrically connected to, and driven by, a first driver, wherein radial shifts and orientation angles of the first sub-group of multipole structures are substantially equal.

5. The array of claim 4, wherein the second group of multipole structures comprises:
a second sub-group of multipole structures that are electrically connected to, and driven by, a second driver, wherein radial shifts and orientation angles of the second sub-group of multipole structures are substantially equal.

6. The array of claim 5, wherein a driver of the first and second drivers is configured to enable corresponding multipole structures to deflect the plurality of charged particle beams in a multi-beam apparatus, and wherein further the plurality of multipole structures are configured as image-forming elements or pre-bending micro-deflectors in the multi-beam apparatus.

7. The array of claim 1, wherein a multipole structure of the first group has an inner diameter larger than a multipole structure of the second group.

8. The array of claim 3, wherein the first group and the second group are arranged in a first layer of the array, and wherein the array further comprises a second layer that comprises a third group of multipole structures having a third radial shift from the central axis of the array.

9. The array of claim 8, wherein the third radial shift is different than the first set of radial shifts or the second set of radial shifts.

10. The array of claim 8, wherein a number of pole electrodes of the third multipole structure is different than, or equal to, a number of pole electrodes of a multipole structure of the first group of multipole structures.

11. The array of claim 8, wherein one of the plurality of charged particle beams is deflected by a multipole structure of the first layer, and another one of the plurality of charged particle beams is deflected by a multipole structure of the second layer.

12. The array of claim 8, wherein one of the plurality of charged particle beams is deflected by a multipole structure of the first layer and a multipole structure of the second layer in series, and the multipole structure of the first layer and the multipole structure of the second layer are aligned to each other.

13. The array of claim 8, wherein:
a first beam of the plurality of charged particle beams is deflected by a multipole structure of the first layer and is not deflected by any multipole structure of the second layer,
a second beam of the plurality of charged particle beams is deflected by a multipole structure of the second layer and is not deflected by any multipole structure of the second layer and
a third beam of the plurality of charged particle beams is deflected by a multipole structure of the first layer and a multipole structure of the second layer in series.

14. A source conversion unit in a charged particle beam system, wherein the source conversion unit comprises a micro-structure deflector array including a plurality of multipole structures, each of the multipole structures comprising a plurality of pole electrodes, the array comprising:
a first group of multipole structures of the plurality of multipole structures, the first group of multipole structures having a first set of radial shifts from a central axis of the array, wherein each multipole structure of the first group comprises a same number of pole electrodes; and
a second group of multipole structures of the plurality of multipole structures, the second group of multipole structures having a second set of radial shifts from the central axis of the array, wherein each multipole structure of the second group comprises a same number of pole electrodes,
wherein the first set of radial shifts is different from the second set of radial shifts, wherein a multipole structure of the first group comprises a greater number of pole electrodes than a multipole structure of the second group, and wherein each of the first group and the second group comprises one or more multipole structures.

15. The source conversion unit of claim 14, wherein the first group and the second group are arranged in a first layer of the array, the array further comprising a second layer that comprises a third group of multipole structures having a third radial shift from the central axis of the array.

* * * * *